United States Patent
Chung et al.

(10) Patent No.: US 12,411,633 B2
(45) Date of Patent: Sep. 9, 2025

(54) MEMORY SYSTEM FOR DATA SWAP AND OPERATING METHOD THEREOF

(71) Applicant: SK hynix Inc., Gyeonggi-do (KR)

(72) Inventors: Eui-Young Chung, Seoul (KR); Sang Hyup Lee, Gyeongsangbuk-do (KR); Kwangsu Kim, Gyeonggi-do (KR); Jeongbin Kim, Seoul (KR); Byoung Jin Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 26 days.

(21) Appl. No.: 16/932,234

(22) Filed: Jul. 17, 2020

(65) Prior Publication Data

US 2021/0034286 A1 Feb. 4, 2021

(30) Foreign Application Priority Data

Jul. 29, 2019 (KR) .................. 10-2019-0091612

(51) Int. Cl.
*G06F 3/06* (2006.01)
(52) U.S. Cl.
CPC ............ *G06F 3/0656* (2013.01); *G06F 3/061* (2013.01); *G06F 3/0659* (2013.01); *G06F 3/0679* (2013.01)
(58) Field of Classification Search
CPC ...... G06F 3/0656; G06F 3/061; G06F 3/0659; G06F 3/0679; G06F 3/0611; G11C 7/1042; G11C 7/106; G11C 7/1087; G11C 2207/2236; G11C 2207/2245; G11C 11/4093; G11C 7/10; G11C 11/4076; G11C 5/06
See application file for complete search history.

(56) References Cited

U.S. PATENT DOCUMENTS

2012/0151127 A1* 6/2012 Lim .................... G06F 12/1009
                                                           711/206
2014/0344527 A1* 11/2014 Kaku .................... G06F 9/5066
                                                           711/147
(Continued)

FOREIGN PATENT DOCUMENTS

JP    2011-081730 A    4/2011
JP    2012-155815 A    8/2012
(Continued)

OTHER PUBLICATIONS

Notice of Allowance issued by the Korean Intellectual Property Office on Aug. 2, 2021.

(Continued)

*Primary Examiner* — Kenneth M Lo
*Assistant Examiner* — Jonah C Krieger
(74) *Attorney, Agent, or Firm* — IP & T GROUP LLP

(57) ABSTRACT

Disclosed are a memory system for a data swap and an operating method thereof. A memory system may include a plurality of layers coupled through at least one through silicon via (TSV) channel and a swap controller configured to generate a swap control command in response to a request received from an external host and to device swap data into a plurality of data units having a predetermined size to perform a swap operation between a first layer and a second layer among the plurality of layers, wherein the first layer and the second layer include at least one swap buffer and control a movement of the plurality of data units in response to the swap control command.

9 Claims, 27 Drawing Sheets

(56) References Cited

U.S. PATENT DOCUMENTS

2016/0335181 A1* 11/2016 Wang ................. G11C 13/0023
2017/0263306 A1*  9/2017 Murphy .............. G11C 11/4091
2022/0027232 A1*  1/2022 Lee .................... G11C 13/0061

FOREIGN PATENT DOCUMENTS

| | | |
|---|---|---|
| JP | 2014-530422 A | 11/2014 |
| KR | 10-2011-0137565 A | 12/2011 |
| KR | 10-2014-0075416 | 6/2014 |
| KR | 10-2015-0133084 A | 11/2015 |
| KR | 10-2016-0073334 A | 6/2016 |
| KR | 10-1648725 B1 | 8/2016 |
| KR | 10-2016-0150451 | 12/2016 |
| KR | 10-2017-0046862 | 5/2017 |
| KR | 10-2017-0138926 | 12/2017 |

OTHER PUBLICATIONS

Office Action issued by the Korean Patent Office on Oct. 26, 2020.

* cited by examiner

MEMORY SYSTEM FOR DATA SWAP AND OPERATING METHOD THEREOF

CROSS-REFERENCE TO RELATED APPLICATION

This application claims priority under 35 U.S.C. § 119 to Korean Patent Application No. 10-2019-0091612 filed on Jul. 29, 2019, which is incorporated herein by reference in its entirety.

BACKGROUND

1. Field

Exemplary embodiments relate to a memory system and an operating method thereof, and more particularly, to technical spirit in which a data swap operation is performed in a memory system in which a plurality of layers has been stacked.

2. Discussion of the Related Art

Recent semiconductor memories require performance, such as high-speed data reliability, high-speed memory access, low power consumption and a reduced chip size. To this end, a three-dimensional (3D) memory system was introduced.

Specifically, the 3D memory system is formed by vertically stacking memory layers (e.g., memory chips) and coupling the memory layers using a through silicon via (TSV).

An advantage of the 3D memory device may include a short interconnection distance for reducing circuit delay and power consumption. The 3D memory system contributes to high-speed memory access, low power consumption and a chip size reduction through the advantage.

For example, the 3D memory system may include a hybrid memory cube (HMC), a high bandwidth memory (HBM) and a wide I/O dynamic random access memory (DRAM).

The 3D memory system performs a data swap operation between the vertically stacked layers, but the vertically stacked layers perform the swap operation through the TSV channel. Accordingly, the vertically stacked layers have a limit to swap speed improvements because they can move only data of a single bank at a time.

PRIOR ART DOCUMENT (Patent Document 1) Korean Patent Application Laid-Open No. 10-2017-0046862 "MEMORY SYSTEM AND OPERATING METHOD OF MEMORY SYSTEM"

SUMMARY

Various embodiments are directed to the provision of a memory system and an operating method thereof, which can improve a swap speed by optimizing a data swap operation using a swap buffer included in at least one layer.

Also, various embodiments are directed to the provision of a memory system and a method thereof, which can improve the bandwidth utilization of a TSV channel by performing bank-level interleaving in a preset movement unit.

In an embodiment, a memory system may include a plurality of layers coupled through at least one through silicon via (TSV) channel, and a swap controller configured to generate a swap control command in response to a request received from an external host and to device swap data into a plurality of data units having a predetermined size to perform a swap operation between a first layer and a second layer among the plurality of layers, wherein the first layer and the second layer include at least one swap buffer and control a movement of the plurality of data units in response to the swap control command.

In an embodiment, the swap controller may generate the swap control command that controls the plurality of data units to be sequentially moved.

In an embodiment, the swap controller may generate the swap control command that controls the plurality of data units of first swap data, included in the first layer, to be moved to a first row buffer and the plurality of data units of second swap data, included in the second layer, to be moved to a second row buffer.

In an embodiment, the swap controller may generate the swap control command that controls first data unit of the second swap data, moved to the second row buffer, to be moved to the swap buffer and first data unit of the first swap data, moved to the first row buffer, to be moved to the second row buffer.

In an embodiment, the swap controller may generate the swap control command that controls the first data unit of the second swap data, moved to the swap buffer, to be moved to the first row buffer.

In an embodiment, the swap controller may generate the swap control command that controls the first data unit of the second swap data, moved to the swap buffer, to be moved to the first row buffer and second data unit of the second swap data, moved to the second row buffer, to be moved to the swap buffer.

In an embodiment, the swap controller may generate the swap control command that controls the second swap data, moved to the first row buffer, to be written in a cell array of the first layer when all of the data units of the second swap data are moved to the first row buffer.

In an embodiment, the swap controller may generate the swap control command that controls third swap data, included in the first layer, to be moved to a third row buffer while the second swap data are written in the first bank.

In an embodiment, a memory system may include a plurality of layers coupled through at least one through silicon via (TSV) channel, and a swap controller configured to perform a data swap operation between a first layer having a first swap buffer and a second layer having a second swap buffer among the plurality of layers and to generate a control command and to divide swap data into a plurality of data units having a predetermined size to control a movement of the swap data included in the first layer and the second layer.

In an embodiment, the swap controller may generate the control command that controls the plurality of data units to be sequentially moved.

In an embodiment, each of the first swap buffer and the second swap buffer may be included in each of a plurality of banks included in each of the first layer and the second layer.

In an embodiment, the swap controller may generate the control command that controls first swap data, included in a first bank of a plurality of banks included in the first layer, to be moved to a first row buffer corresponding to the first bank and second swap data, included in a second bank of a plurality of banks included in the second layer, to be moved to a second row buffer corresponding to the second bank.

In an embodiment, the swap controller may generate the control command that controls first data unit of the second swap data, moved to the second row buffer, to be moved to the first swap buffer and first data unit of the first swap data, moved to the first row buffer, to be moved to the second row buffer.

In an embodiment, the swap controller may generate the control command that controls the first data unit of the second swap data, moved to the first swap buffer, to be moved to the first row buffer and second data unit of the second swap data, moved to the second row buffer, to be moved to the second swap buffer.

In an embodiment, the swap controller may generate the control command that controls second data unit of the first swap data, moved to the first row buffer, to be moved to the second row buffer and the second data unit of the second swap data, moved to the second swap buffer, to be moved to the first row buffer.

In an embodiment, the swap controller may generate the control command that controls the second swap data, moved to the first row buffer, to be written in the first bank when all of the second swap data are moved to the first row buffer.

In an embodiment, the swap controller may generate the control command that controls third swap data, included in a third bank of the plurality of banks included in the first layer, to be moved to a third row buffer corresponding to the third bank while the second swap data are written in the first bank.

DETAILED DESCRIPTION

Figure 1:
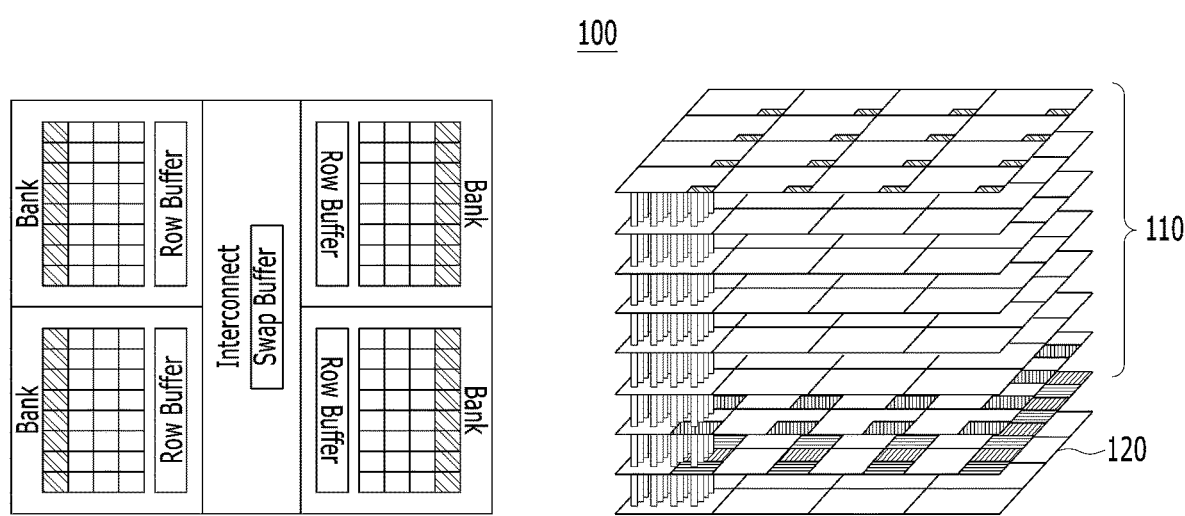
FIG. 1 is a diagram for describing a memory system according to an embodiment.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

A specific structural or functional description of embodiments according to the concept of the present disclosure disclosed in this specification has been merely illustrated for the purpose of describing the embodiments according to the concept of the present disclosure. The embodiments according to the concept of the present disclosure may be implemented in various forms and are not limited to the embodiments described in this specification.

The embodiments according to the concept of the present disclosure may be changed in various ways and may have various forms, and thus the embodiments are illustrated in the drawings and described in detail in this specification. However, this is not intended to limit the embodiments according to the concept of the present disclosure to specific disclosed forms. The embodiments include all changes, equivalents or substitutes included in the spirit and technical scope of the present disclosure.

Terms, such as the first and the second, may be used to describe various elements, but the elements should not be restricted by the terms. The terms are used to only distinguish one element from the other element. For example, a first element may be named a second element without departing from the scope of rights of the present disclosure. Likewise, a second element may be named a first element.

When it is said that one element is "connected" or "coupled" to the other element, it should be understood that one element may be directly connected or coupled" to the other element, but a third element may exist between the two elements. In contrast, when it is described that one element is "directly connected" or "directly coupled" to the other element, it should be understood that a third element does not exist between the two elements. An expression to describe a relation between elements, for example, "between ~" or "just between ~" or "directly neighboring ~" should be likewise construed.

The terms used in this specification are used to only describe specific embodiments and are not intended to restrict the present disclosure. An expression of the singular number should be construed as including an expression of the plural number unless clearly defined otherwise in the context. It is to be understood that in this specification, a term, such as "include (or comprise)" or "have", is intended to designate that a characteristic, number, step, operation, element or part which is described in the specification or a combination of them are present and does not exclude the existence or possible addition of one or more other characteristics, numbers, steps, operations, elements, parts or combinations of them in advance.

All terms used herein, including technical terms or scientific terms unless defined otherwise in the specification, have the same meanings as those commonly understood by a person having ordinary skill in the art to which the present disclosure pertains. Terms, such as those commonly used and defined in dictionaries, should be construed as having the same meanings as those in the context of a related technology, and should not be construed as having ideal or excessively formal meanings unless explicitly defined otherwise in the specification.

Hereinafter, embodiments are described in detail with reference to the accompanying drawings. However, the scope of the present application is not limited or restricted by such embodiments. The same reference numeral illustrated in each drawing denotes the same member.

FIG. 1 is a diagram for describing a memory system 100 according to an embodiment.

Referring to FIG. 1, the memory system 100 according to an embodiment can improve a swap speed by optimizing a data swap operation using a swap buffer included in at least one layer.

Furthermore, the memory system 100 according to an embodiment can improve the bandwidth utilization of a through silicon via (TSV) channel by performing bank-level interleaving in a preset movement unit.

To this end, the memory system 100 may include a plurality of layers 110 and a swap controller 120.

For reference, a term "data swap" described in the present disclosure involves a broad sense meaning, used in an algorithm- and software-related field, the broad sense meaning indicating that the locations of data are exchanged, and are not limited to a data swap scheme used in a data management scheme of an operating system.

The plurality of layers 110 according to an embodiment may be coupled through at least one TSV channel.

In other words, the plurality of layers 110 may be vertically stacked and coupled through the TSV channels.

Specifically, the plurality of layers 110 may be formed by stacking a plurality of memory layers and a plurality of storage layers.

The memory layer is a memory having a high data processing speed, and may be configured as a dynamic random access memory (DRAM), for example, but the disclosure is not limited thereto. The storage layer may be a memory having a relatively high memory capacity because it has higher density than the memory layer.

In other words, the memory layer may be a memory having a higher processing speed and lower capacity than the storage layer. The storage layer may be a memory having a lower processing speed and higher integration density than the memory layer.

For example, the storage layer may be any one of a flash memory, a PRAM and an MRAM having a relatively greater read/write delay time than a DRAM, but the disclosure is not limited thereto.

According to an aspect, the memory layer and the storage layer may be configured as the same type of memory, such as a PRAM, and may be configured as memories having different characteristics, such as an optimization characteristic, a process technology characteristic and a single level cell (SLC)/multi-level cell (MLC).

According to an aspect, each of the plurality of layers 110 may include a plurality of banks in a region corresponding to each of a plurality of TSV channels. Each of the plurality of banks may include a row buffer.

According to an aspect, each of the plurality of layers 110 of the memory system 100 may include four banks in one TSV channel, but the memory system 100 according to an embodiment is not limited thereto. For example, four or less banks or four or more banks may be included in one TSV channel.

For example, each of the plurality of banks may include a sub-array. The row buffer may store data corresponding to any one row in the sub-array, and may perform a read and write operation.

As a more detailed example, when any one row is selected through a row decoder, the row buffer may read data stored in the selected row and store the read data therein.

Furthermore, a column may be selected through a column decoder, and desired row/column data among the data stored in the row buffer may be output.

According to an aspect, at least one layer of the plurality of layers 110 may include a swap buffer.

For example, the memory system 100 may include a swap buffer in a plurality of memory layers or a plurality of storage layers of the plurality of layers 110.

Furthermore, the memory system 100 may include a swap buffer in each of the plurality of layers 110.

Furthermore, the memory system 100 may include swap buffers in each of a plurality of banks included in each of the plurality of layers 110.

The swap controller 120 according to an embodiment may determine whether to perform a data swap between a first layer and second layer of the plurality of layers, and may generate a control command to control a movement of swap data included in the first layer and the second layer based on a result of the determination.

For example, each of the first layer and the second layer may be at least one of the memory layer and the storage layer.

Furthermore, the swap data may be data or an image of a virtual machine (VM) included in each of the first layer and the second layer.

In other words, the swap controller 120 may generate a control command for controlling a data swap operation performed between the first layer and the second layer.

For example, the swap controller 120 may receive a request signal for a data swap operation from a host apparatus, may generate a control command in response to the received request, and may control a movement of swap data by providing the generated control command to each corresponding layer.

According to an aspect, the swap controller 120 may generate a control command for improving the bandwidth utilization of a TSV channel by performing bank-level interleaving in a preset movement unit.

Figure 2A:
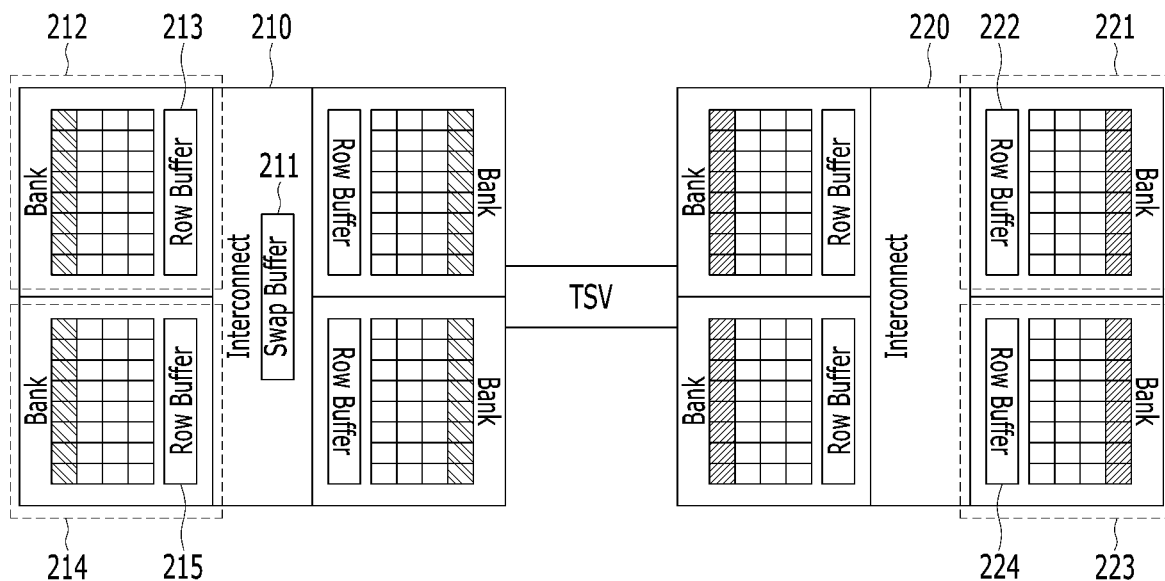
FIGS. 2A and 2B are diagrams for describing first and second embodiments of a memory system.
Figure 2B:
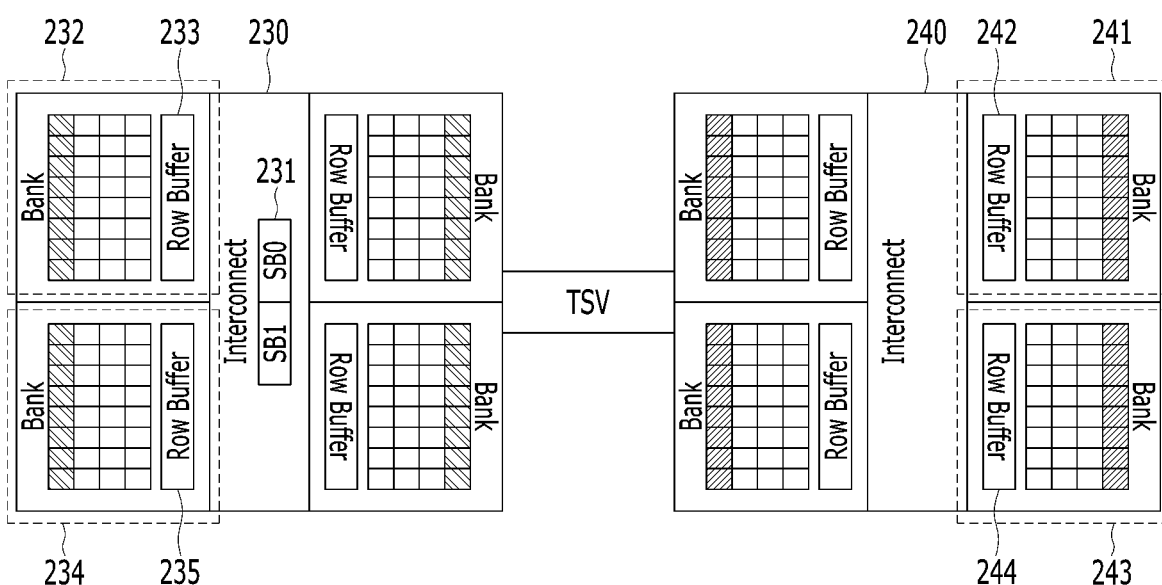
Figure 3A:
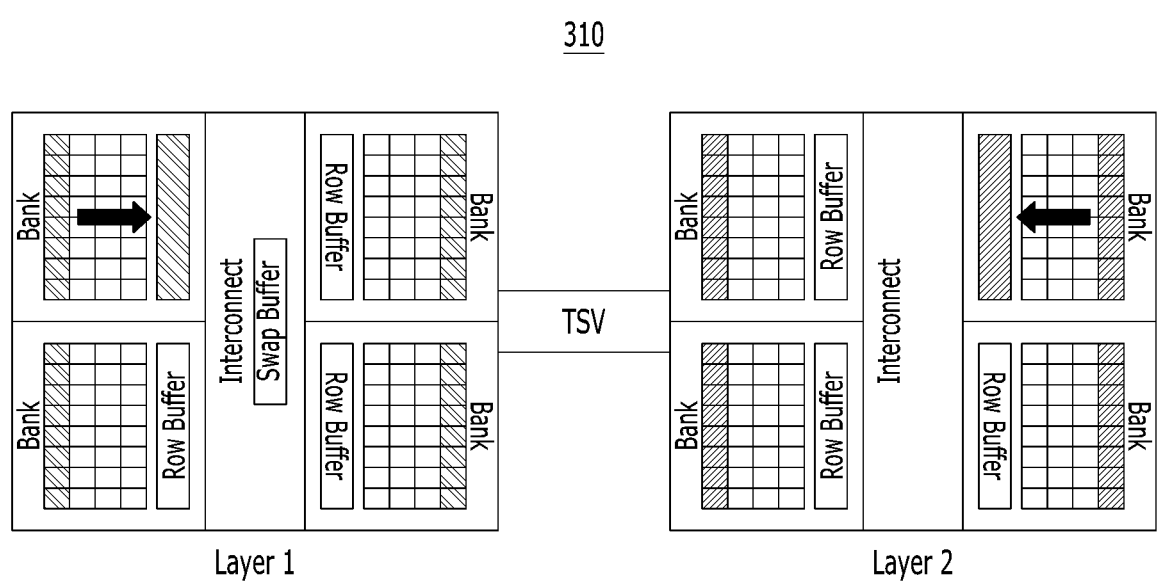
FIGS. 3A to 3F are diagrams for describing an example of an operating method of the memory system according to the first embodiment.
Figure 3B:
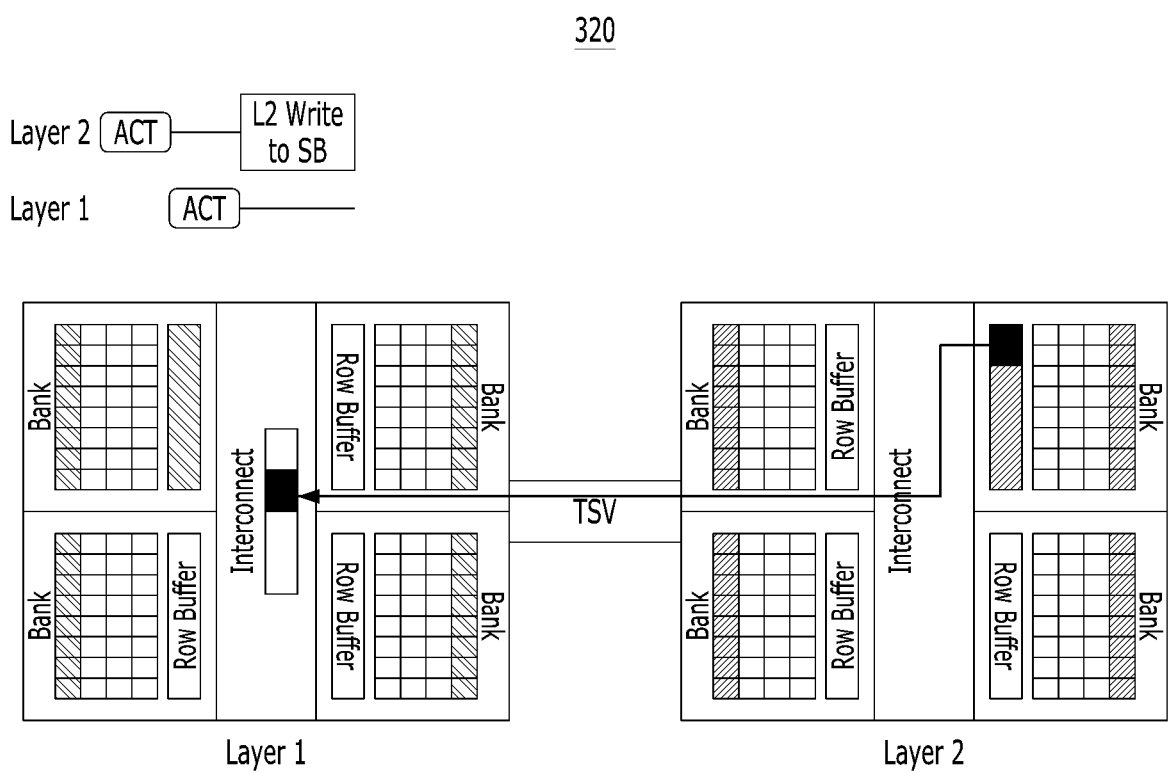
Figure 3C:
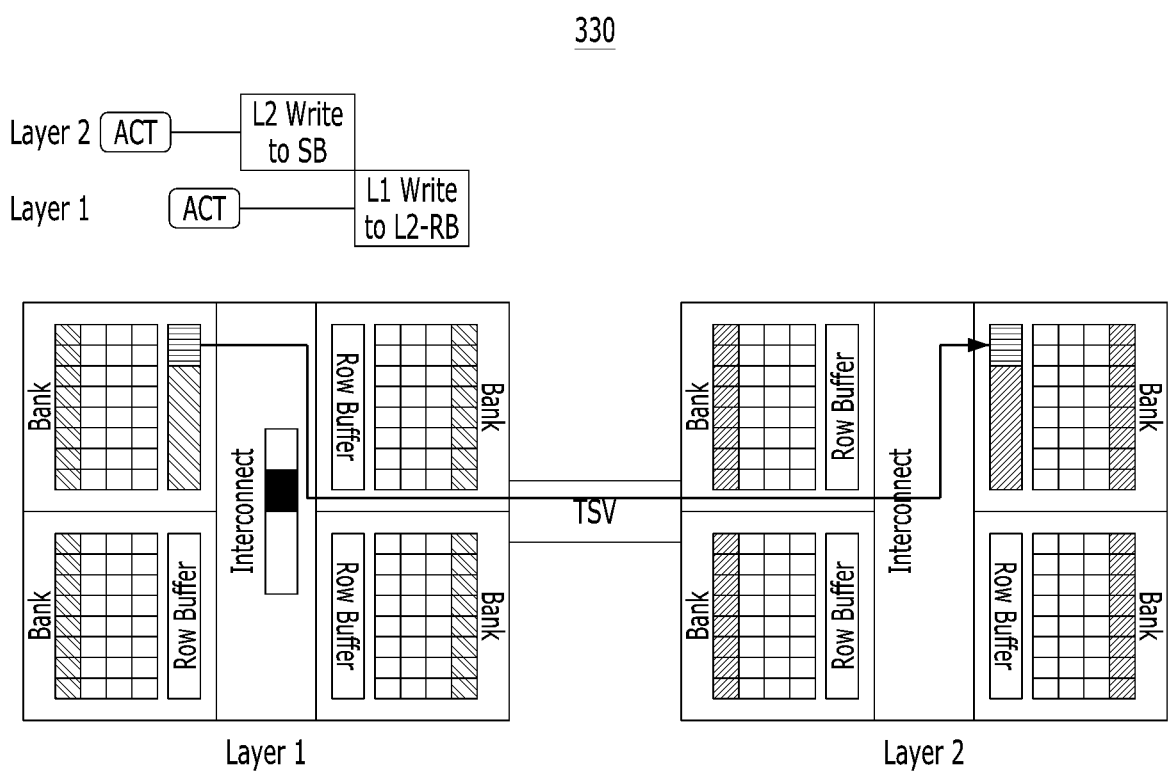
Figure 3D:
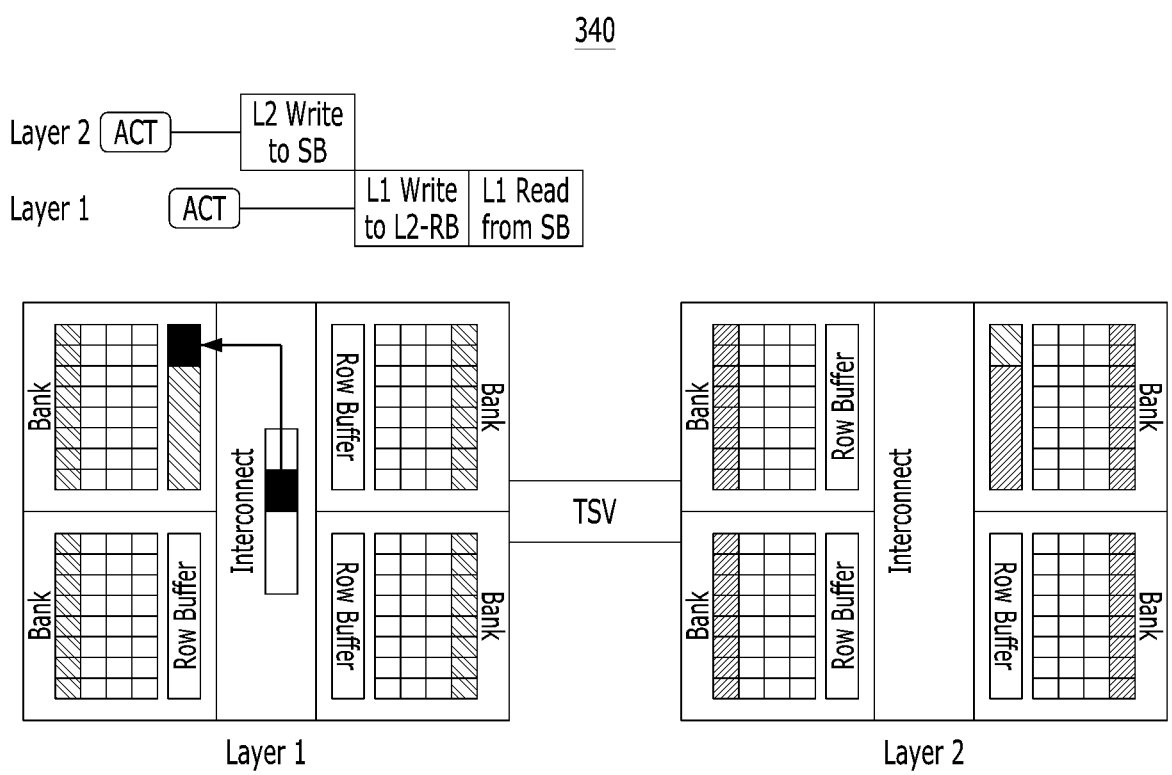
Figure 3E:
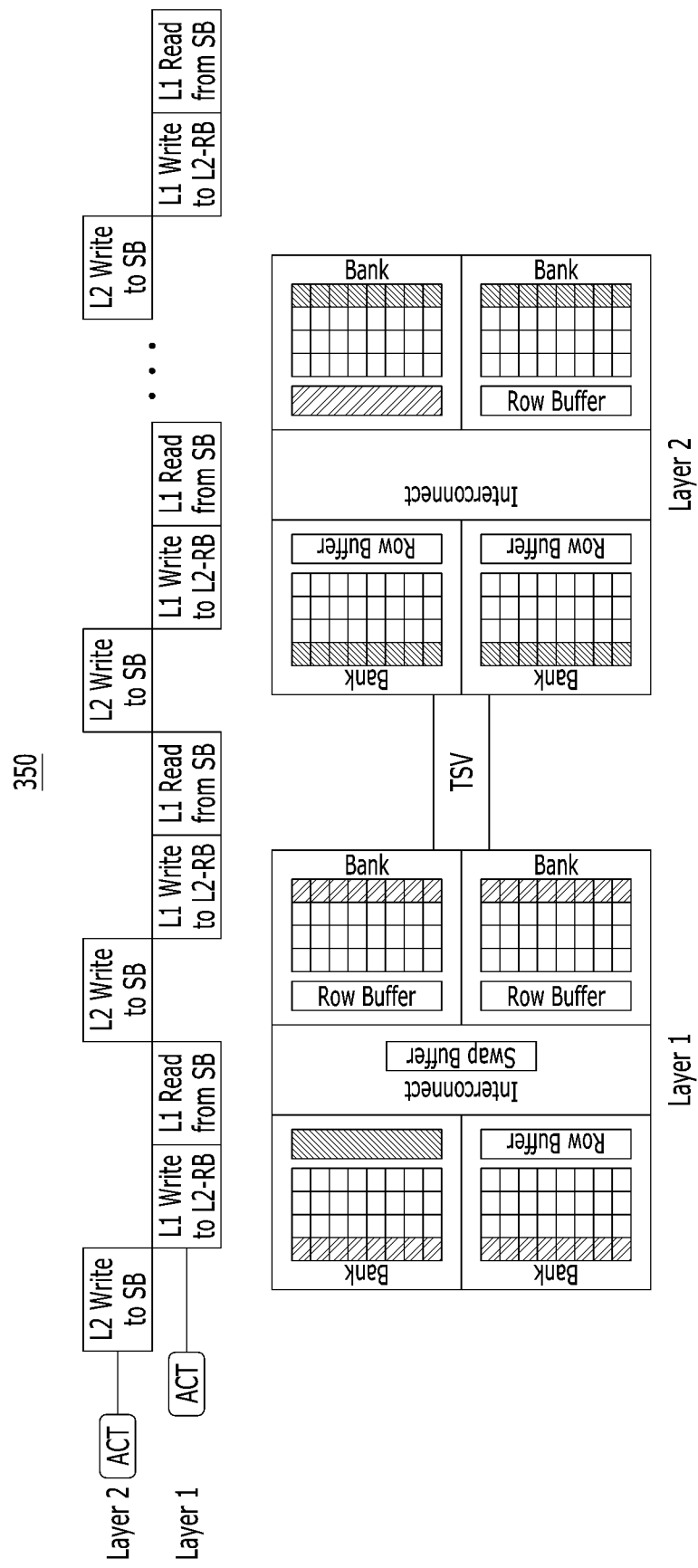
Figure 3F:
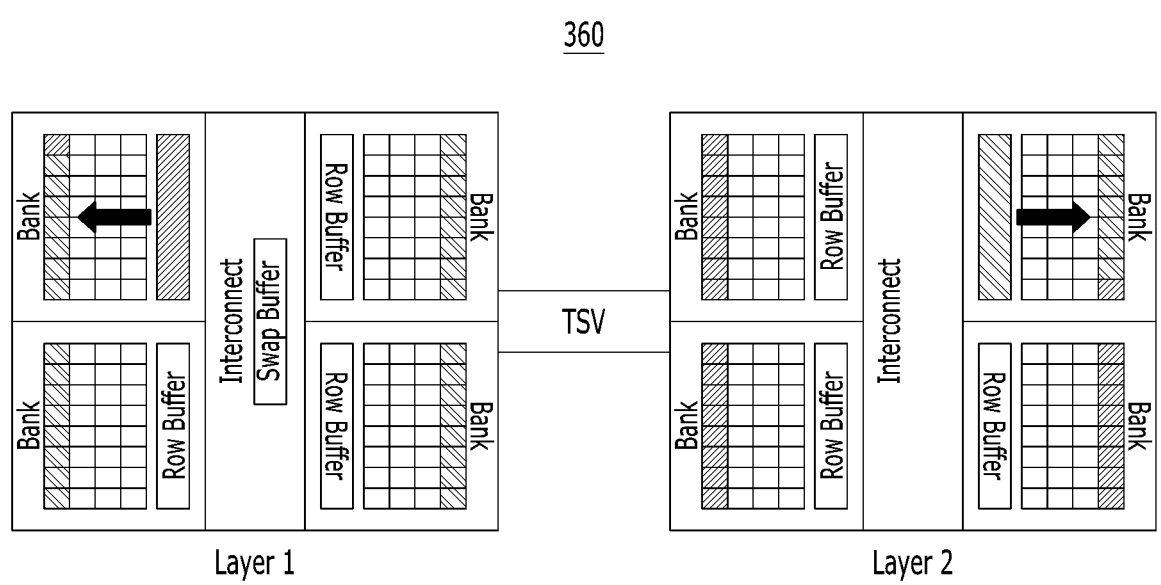
Figure 4A:
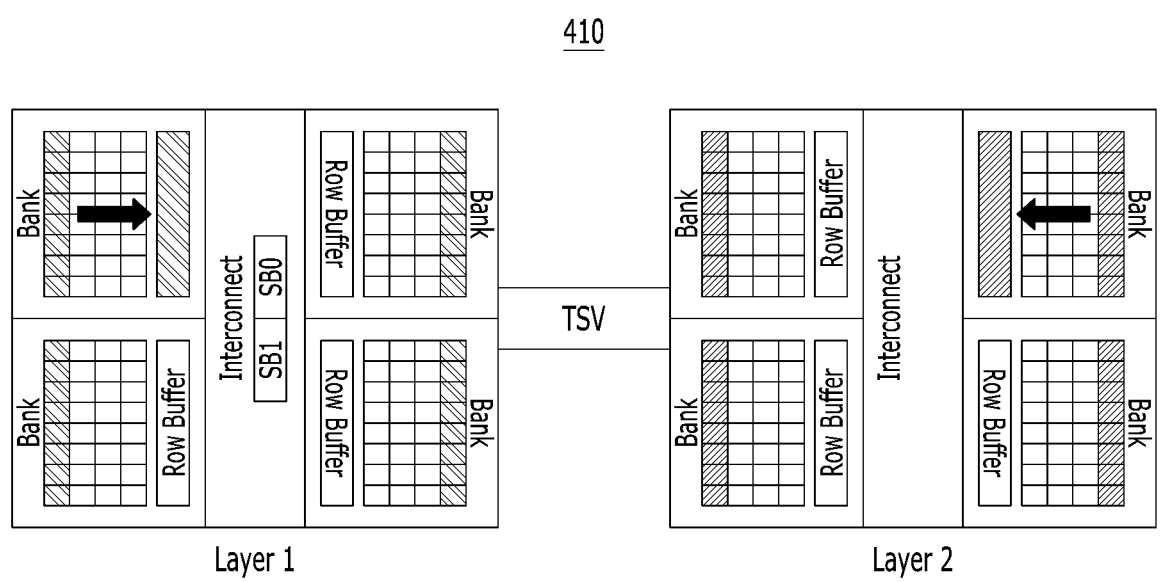
FIGS. 4A to 4F are diagrams for describing another example of an operating method of the memory system according to the second embodiment.
Figure 4B:
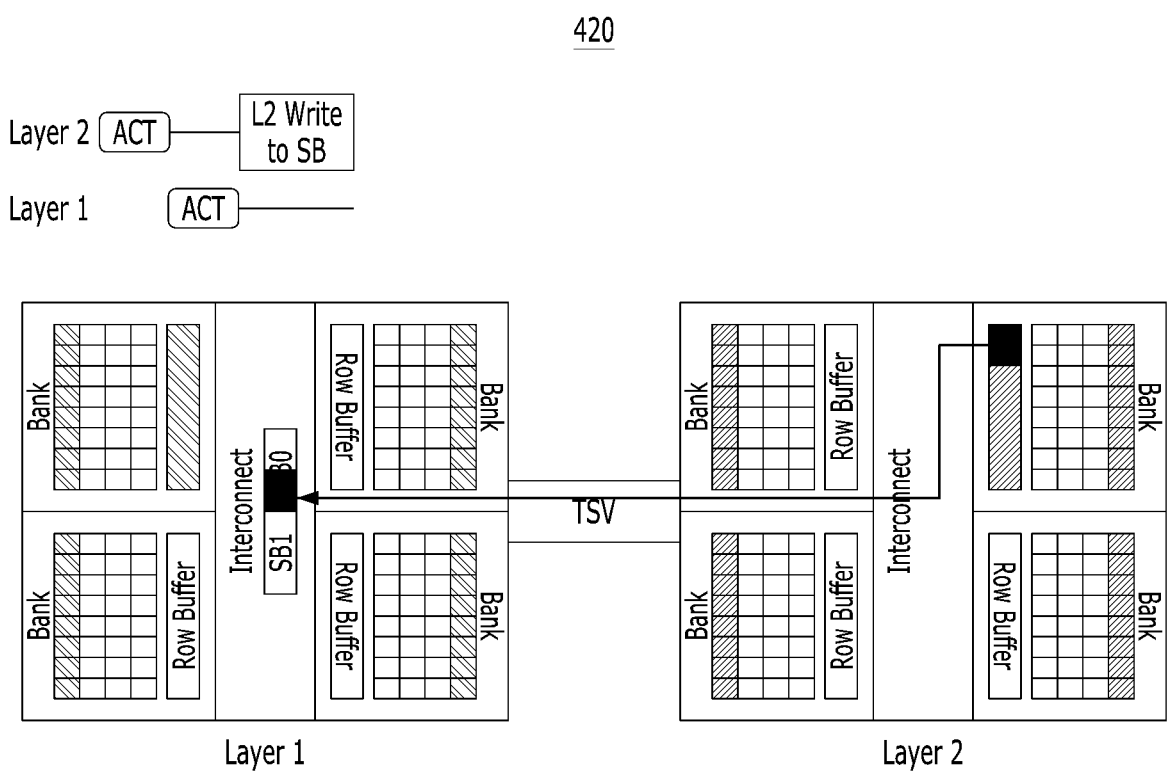
Figure 4C:
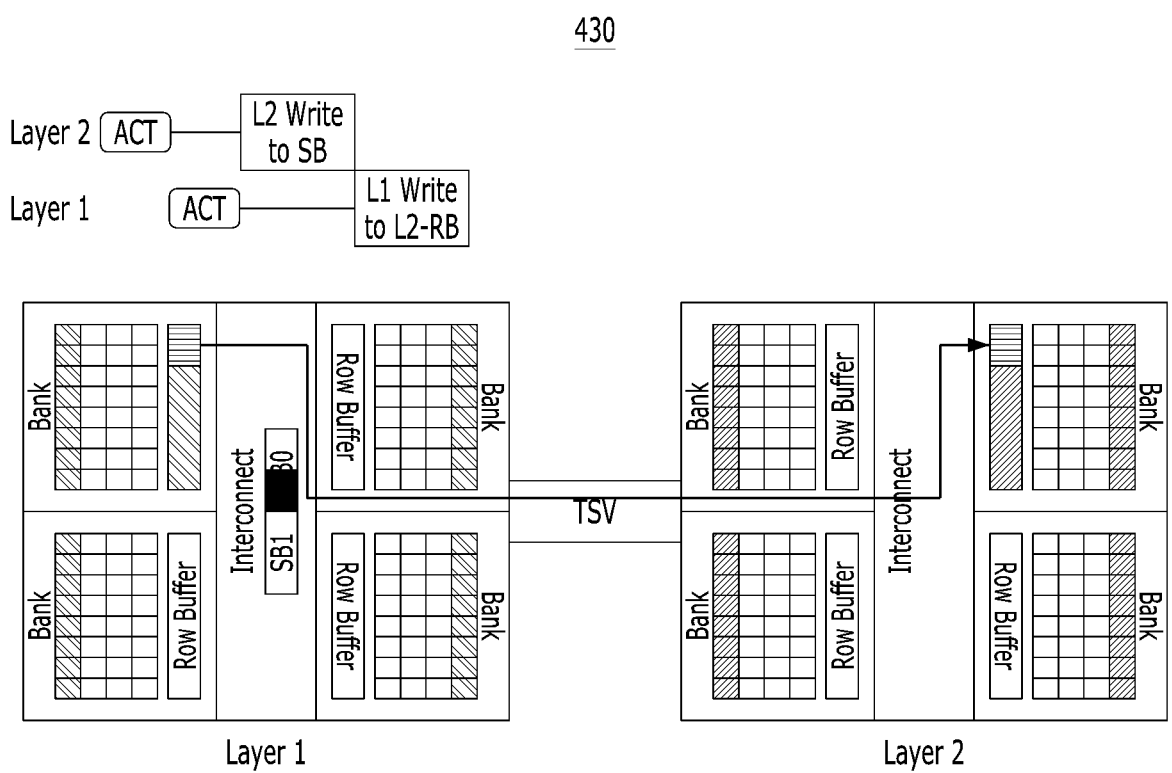
Figure 4D:
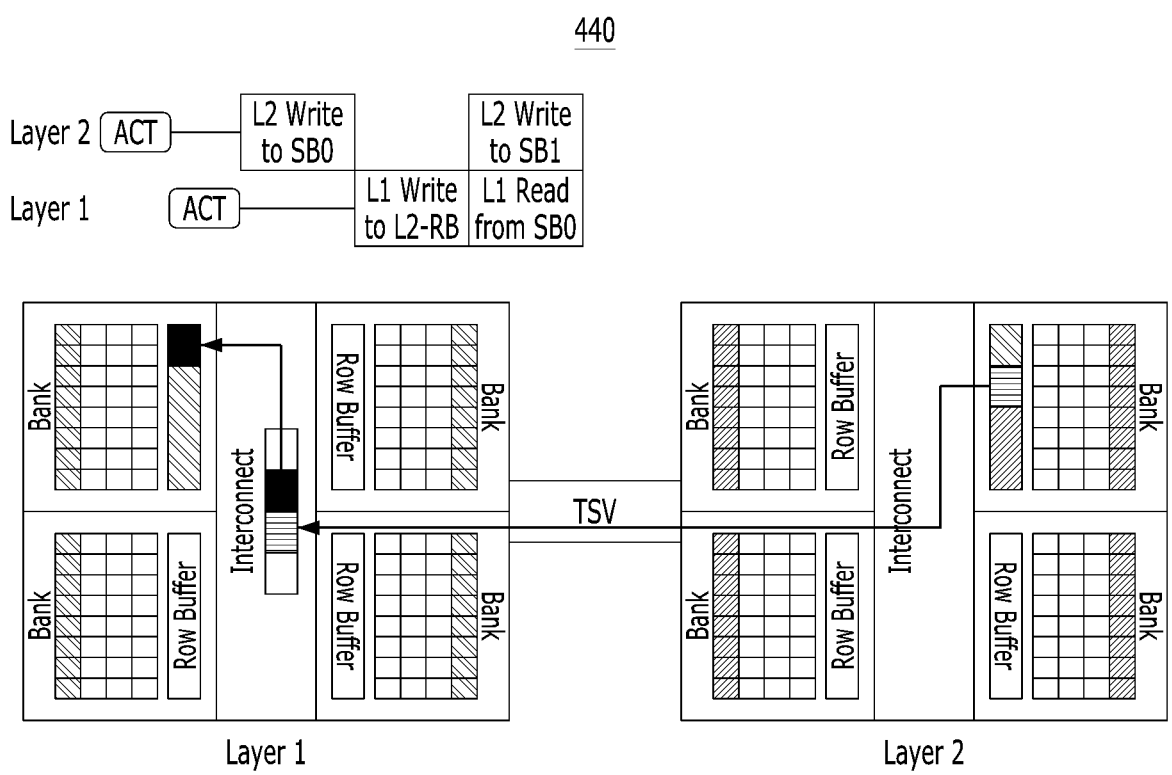
Figure 4E:
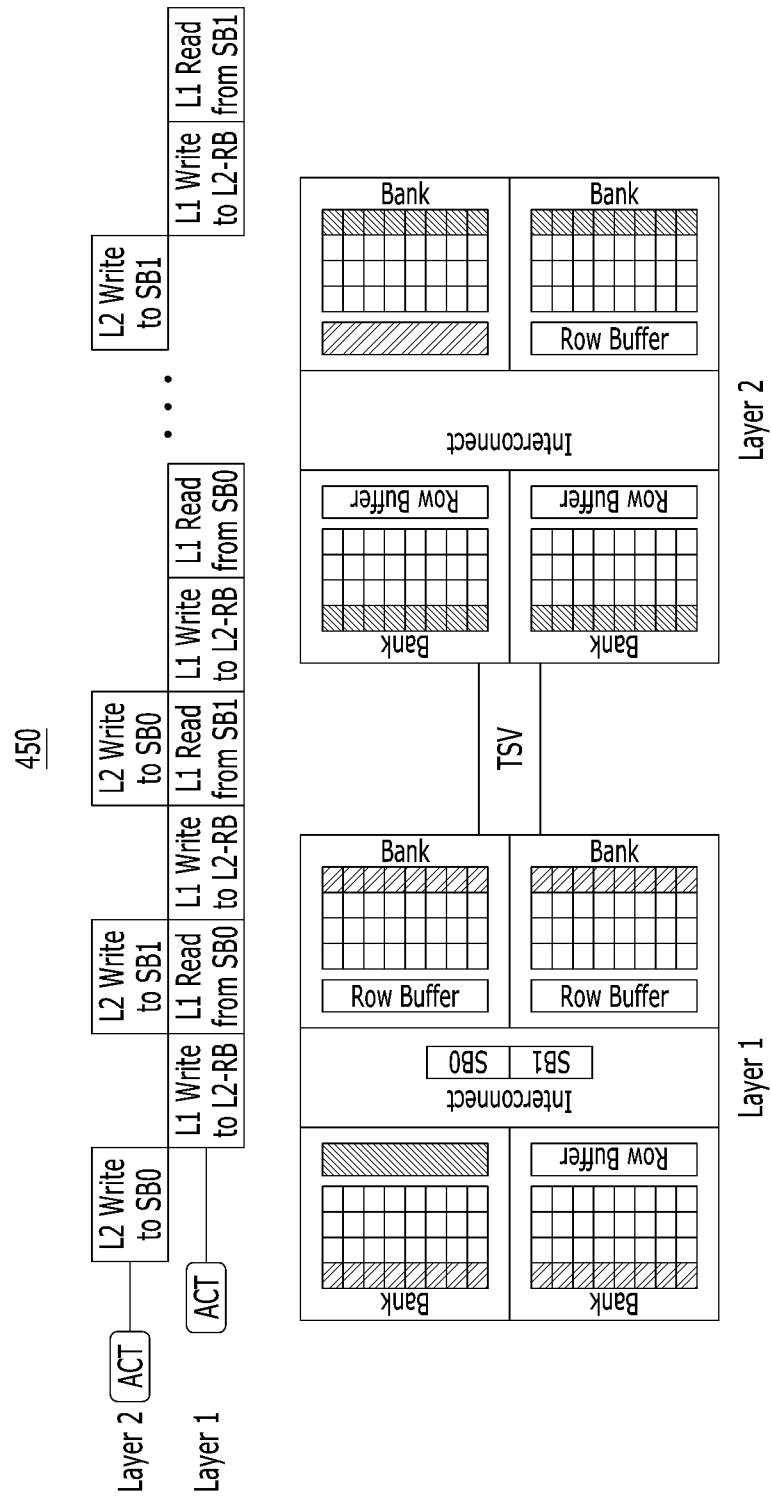
Figure 4F:
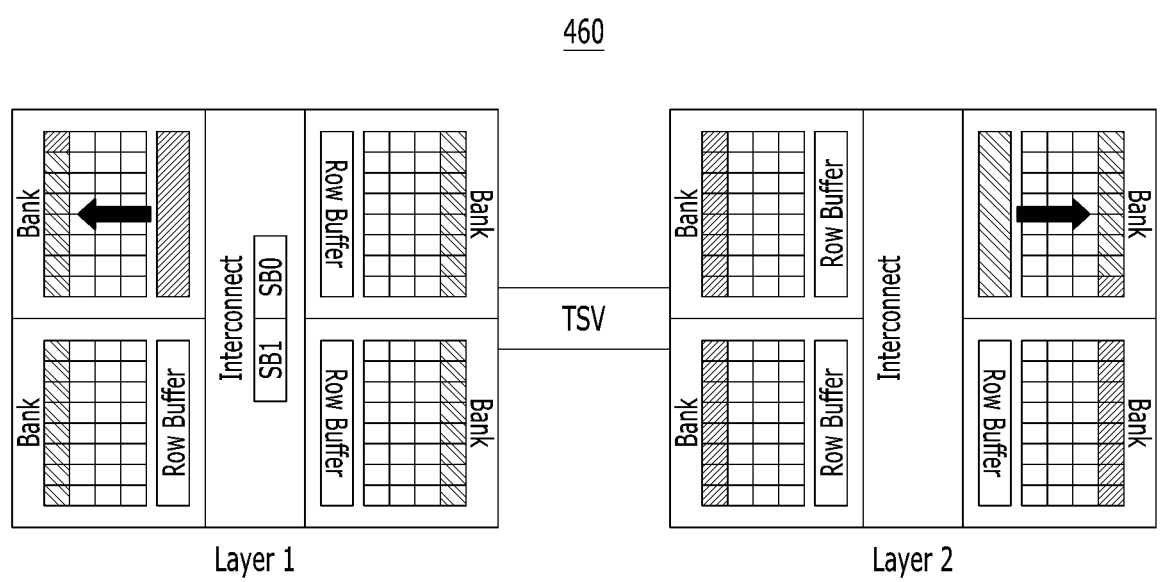

FIGS. 2A and 2B are diagrams for describing first and second embodiments of a memory system 200.

In other words, FIGS. 2A and 2B are diagrams describing an example of the memory system according to an embodiment, which has been described with reference to FIG. 1. A description redundant with the description described in connection with the memory system according to an embodiment, among contents described with reference to FIGS. 2A and 2B, will be omitted.

FIG. 2A illustrates the memory system 200 according to the first embodiment, and FIG. 2B illustrates the memory system 200 according to the second embodiment.

The memory system 200 according to the first embodiment is described below with reference to FIG. 2A.

Referring to FIG. 2A, the swap controller of the memory system 200 according to an embodiment may determine whether to perform a data swap between a first layer 210 including a swap buffer 211 and a second layer 220 among a plurality of layers coupled through at least one TSV channel, and may generate a control command to control a movement of swap data included in the first layer 210 and second layer 220 based on a result of the determination.

In other words, the memory system 200 according to the first embodiment has a structure in which the swap buffer 211 is present in only some of the plurality of layers. The memory system 200 may perform a data swap operation between some layers or two banks included in a layer including the swap buffer 211 through the same TSV channel.

That is, the memory system 200 according to the first embodiment can improve the speed of a data swap operation with low overhead while minimizing the use of the swap buffer.

For example, the swap controller may be the swap controller 120 illustrated in FIG. 1. The first layer 210 may be a memory layer, and the second layer 220 may be a storage layer.

Furthermore, the first layer 210 may be a storage layer, and the second layer 220 may be a memory layer.

According to an aspect, each of the plurality of layers may include a plurality of banks in a region corresponding to each of a plurality of TSV channels. Each of the plurality of banks may include a row buffer.

For example, a first bank 212 among the plurality of banks of the first layer 210 may include a corresponding first row buffer 213, and a third bank 214 among them may include a corresponding third row buffer 215.

Furthermore, a second bank 221 among the plurality of banks of the second layer 220 may include a corresponding second row buffer 222, and a fourth bank 223 among them may include a corresponding fourth row buffer 224.

An operating method of the memory system according to the first embodiment is more specifically described later with reference to FIGS. 3A to 3F.

The memory system according to the second embodiment is described below with reference to FIG. 2B.

Referring to FIG. 2B, a first layer 230, a first bank 232, a first row buffer 233, a third bank 234, a third row buffer 235, a second layer 240, a second bank 241, a second row buffer 242, a fourth bank 243 and a fourth row buffer 244 have the same constructions as the first layer 210, the first bank 212, the first row buffer 213, the third bank 214, the third row buffer 215, the second layer 220, the second bank 221, the second row buffer 222, the fourth bank 223 and the fourth row buffer 224, respectively, described with reference to FIG. 2A. Accordingly, a description redundant with the description described with reference to FIG. 2A will be omitted.

Specifically, the swap controller of the memory system according to an embodiment may determine whether to perform a data swap between the first layer 230 including a swap buffer 231 and the second layer 240 among a plurality of layers coupled through at least one TSV channel, and may generate a control command to control a movement of swap data included in the first layer 230 and the second layer 240 based on a result of the determination.

According to an aspect, the swap buffer 231 may be divided into at least two regions (e.g., SB0 and SB1) and implemented as a dual port, and may be designed to simultaneously perform write and read operations for data in the same time interval.

An operating method of the memory system according to the second embodiment is more specifically described later with reference to FIGS. 4A to 4F.

FIGS. 3A to 3F are diagrams for describing an example of the operating method of the memory system according to the first embodiment.

Referring to FIGS. 3A to 3F, the operating method of the memory system according to the first embodiment may be performed in the memory system according to the first embodiment described with reference to FIG. 2A.

Specifically, at step 310, the swap controller of the memory system may generate a control command that controls first swap data, included in the first bank of the plurality of banks included in the first layer, to be moved to the first row buffer corresponding to the first bank and that controls second swap data, included in the second bank of the plurality of banks included in the second layer, to be moved to the second row buffer corresponding to the second bank.

In other words, the memory system may store the swap data in a corresponding row buffer through row selection in each of the banks including the swap data.

According to an aspect, the swap controller may classify swap data (e.g., first and second swap data) into a plurality of unit data divided in a preset data movement unit, and may generate a control command that controls the plurality of classified unit data to be sequentially moved.

For example, the preset data movement unit may be set based on a page unit or swap buffer unit.

Specifically, the preset data movement unit may be 1 time to m times (wherein m is a positive integer) the unit movement unit which may be transmitted at a time through a TSV. In general, the preset data movement unit may be set as a cache line (64 bytes) level smaller than a page or a unit smaller or greater than the cache line level.

As a more detailed example, the memory system may classify the first swap data, moved to the first row buffer, into first to n-th unit data (wherein n is a positive integer) by dividing the first swap data, and may sequentially move, to the second row buffer, the first to n-th unit data of the first swap data classified for a data swap operation.

Furthermore, the memory system may classify the second swap data, moved to the second row buffer, into first to n-th unit data (wherein n is a positive integer) by dividing the second swap data, and may sequentially move, to the first row buffer, the first to n-th unit data of the second swap data classified for a data swap operation.

At step 320, the swap controller of the memory system may generate a control command (L2 Write to SB) that controls the first unit data of the second swap data, moved to the second row buffer, to be moved to the swap buffer.

For example, after the row selection, the swap controller of the memory system may generate the control command (L2 Write to SB) after tRCD (RAS to CAS), that is, the time taken for the swap data to be stored in the row buffer.

In other words, the memory system may move, to a given space of the swap buffer, the first unit data of the second swap data moved to the second row buffer.

At step 330, the swap controller of the memory system may generate a control command (L1 Write to L2-RB) that controls the first unit data of the first swap data, moved to the first row buffer, to be moved to the second row buffer.

In other words, the memory system may move the first unit data of the first swap data, moved to the first row buffer, to a region that belongs to a plurality of regions of the second row buffer and that corresponds to the first unit data of the second swap data moved to the swap buffer.

At step 340, the swap controller of the memory system may generate a control command (L1 Read from SB) that controls the first unit data of the second swap data, moved to the swap buffer, to be moved to the first row buffer.

In other words, the memory system may move the first unit data of the second swap data, moved to the swap buffer, to a region that belongs to a plurality of regions of the first row buffer and that corresponds to the first unit data of the first swap data moved to the second row buffer.

At step 350, the swap controller of the memory system may repeatedly generate the control commands corresponding to steps 320, 330 and 340 by repeatedly performing steps 320, 330 and 340.

In other words, at step 350, the memory system may move, to the second row buffer, all of the first swap data (i.e., second to n-th unit data) stored in the first row buffer, and may move, to the first row buffer, all of the second swap data (i.e., second to n-th unit data) stored in the second row buffer.

At step 360, the swap controller of the memory system may control the second swap data, moved to the first row buffer, to be written in the first bank when all of the second swap data are moved to the first row buffer, and may control the first swap data, moved to the second row buffer, to be written in the second bank when all of the first swap data are moved to the second row buffer.

FIGS. 4A to 4F are diagrams for describing another example of the operating method of the memory system according to the second embodiment.

Referring to FIGS. 4A to 4F, the operating method of the memory system according to the second embodiment may be performed in the memory system according to the second embodiment, which has been described with reference to FIG. 2B.

Specifically, at step 410, the swap controller of the memory system may generate a control command that controls first swap data, included in the first bank of the plurality of banks included in the first layer, to be moved to the first row buffer corresponding to the first bank and that controls second swap data, included in the second bank of the plurality of banks included in the second layer, to be moved to the second row buffer corresponding to the second bank.

In other words, the memory system may store the swap data in a corresponding row buffer through row selection in each of the banks including the swap data.

According to an aspect, the swap controller may classify swap data (e.g., first and second swap data) into a plurality of unit data divided in a preset data movement unit, and may generate a control command that controls the plurality of classified unit data to be sequentially moved.

For example, the preset data movement unit may be a page unit or a swap buffer unit.

At step 420, the swap controller of the memory system may generate a control command (L2 Write to SB) that controls the first unit data of the second swap data, moved to the second row buffer, to be moved to the swap buffer.

In other words, the memory system may move, to a given space of the swap buffer, the first unit data of the second swap data moved to the second row buffer.

At step 430, the swap controller of the memory system may generate a control command (L1 Write to L2-RB) that controls the first unit data of the first swap data, moved to the first row buffer, to be moved to the second row buffer.

In other words, the memory system may move the first unit data of the first swap data, moved to the first row buffer, to a region that belongs to a plurality of regions of the second row buffer and that corresponds to the first unit data of the second swap data moved to the swap buffer.

At step 440, the swap controller of the memory system may generate a control command (L1 Read from SB0) that controls the first unit data of the second swap data, moved to the swap buffer, to be moved to the first row buffer.

Furthermore, the swap controller may generate a control command (L2 Write to SB1) that controls the second unit data of the second swap data, moved to the second row buffer, to be moved to the swap buffer.

For example, at step 440, the two control commands (L1 Read from SB0 and L2 Write to SB1) generated by the swap controller may be generated in the same time interval.

In other words, the memory system may move the first unit data of the second swap data, moved to the swap buffer, to a region that belongs to a plurality of regions of the first row buffer and that corresponds to the first unit data of the first swap data moved to the second row buffer.

Furthermore, the memory system may move, to a given space of the swap buffer, the second unit data of the second swap data moved to the second row buffer.

For example, the swap buffer included in the first layer may be divided into at least two regions (e.g., SB0 and SB1) and implemented as a dual port and may simultaneously perform write and read operations for data in the same time interval.

At step 450, the swap controller of the memory system may repeatedly generate the control commands corresponding to steps 420, 430 and 440 by repeatedly performing steps 420, 430 and 440.

In other words, at step 450, the memory system may move, to the second row buffer, all of the first swap data (i.e., second to n-th unit data) stored in the first row buffer, and may move, to the first row buffer, all of the second swap data (i.e., second to n-th unit data) stored in the second row buffer.

At step 460, the swap controller of the memory system may control the second swap data, moved to the first row buffer, to be written in the first bank when all of the second swap data are moved to the first row buffer, and may control the first swap data, moved to the second row buffer, to be written in the second bank when all of the first swap data are moved to the second row buffer.

Figure 5:
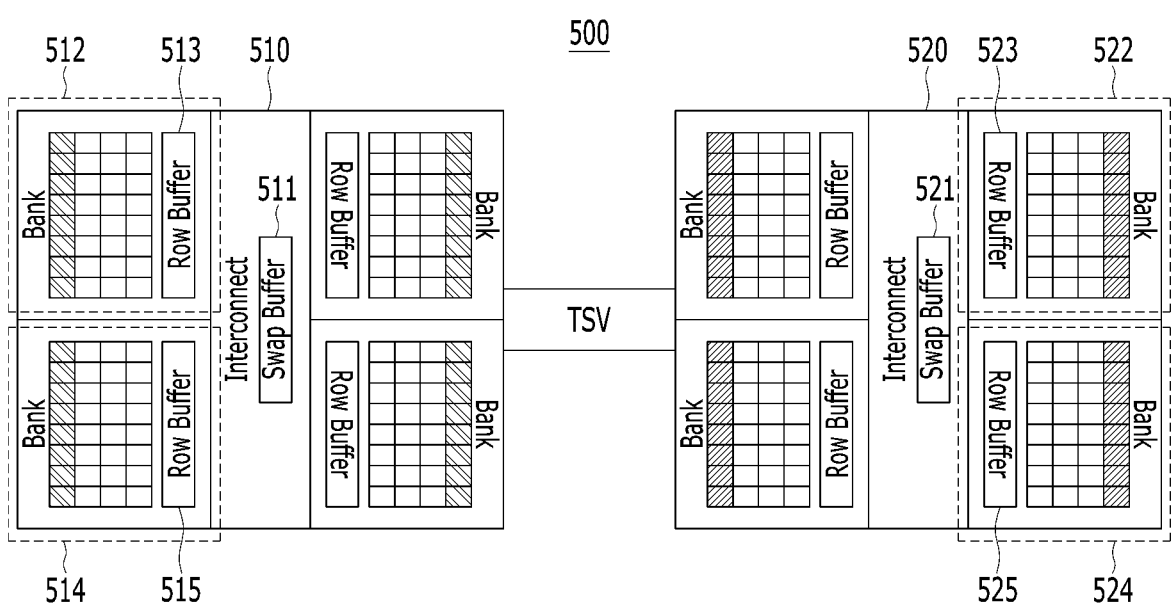
FIG. 5 is a diagram for describing a memory system according to a third embodiment.
Figure 6A:
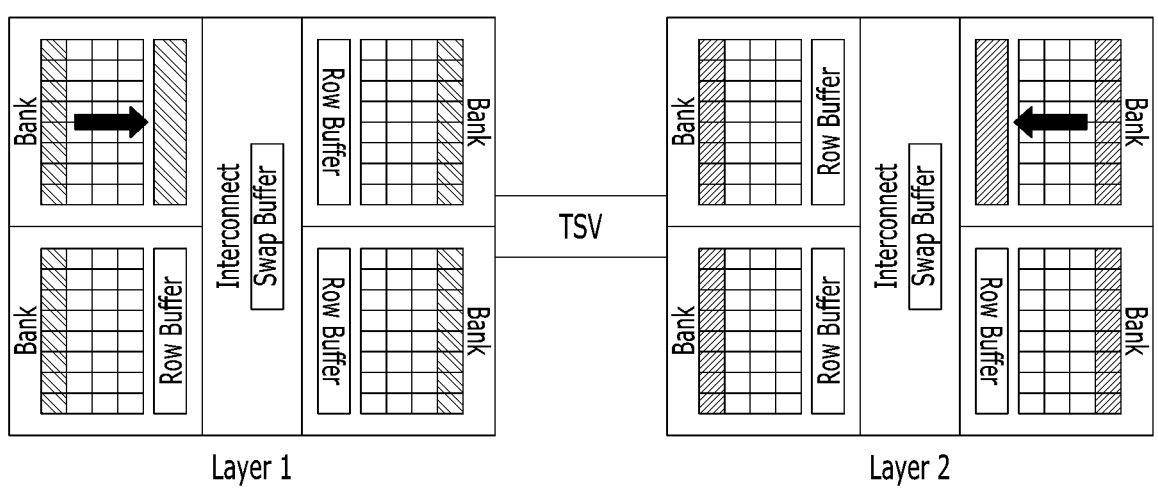
FIGS. 6A to 6H are diagrams for describing an example of an operating method of the memory system according to the third embodiment.
Figure 6B:
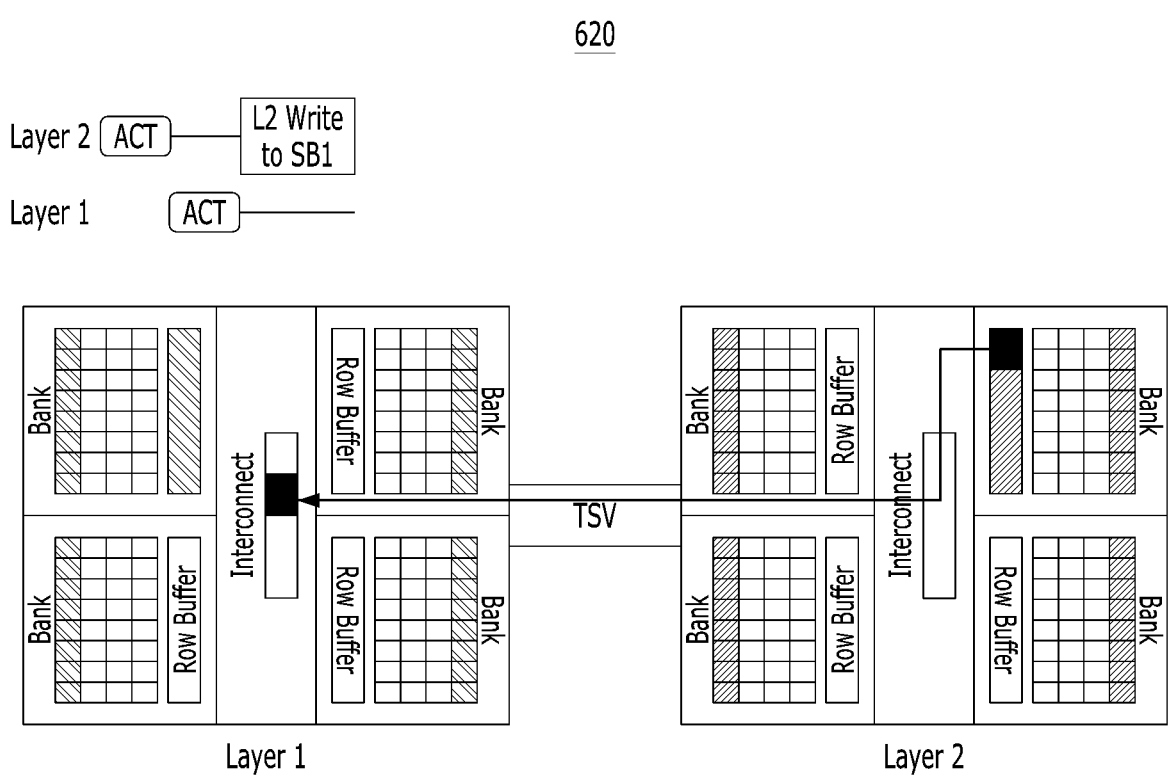
Figure 6C:
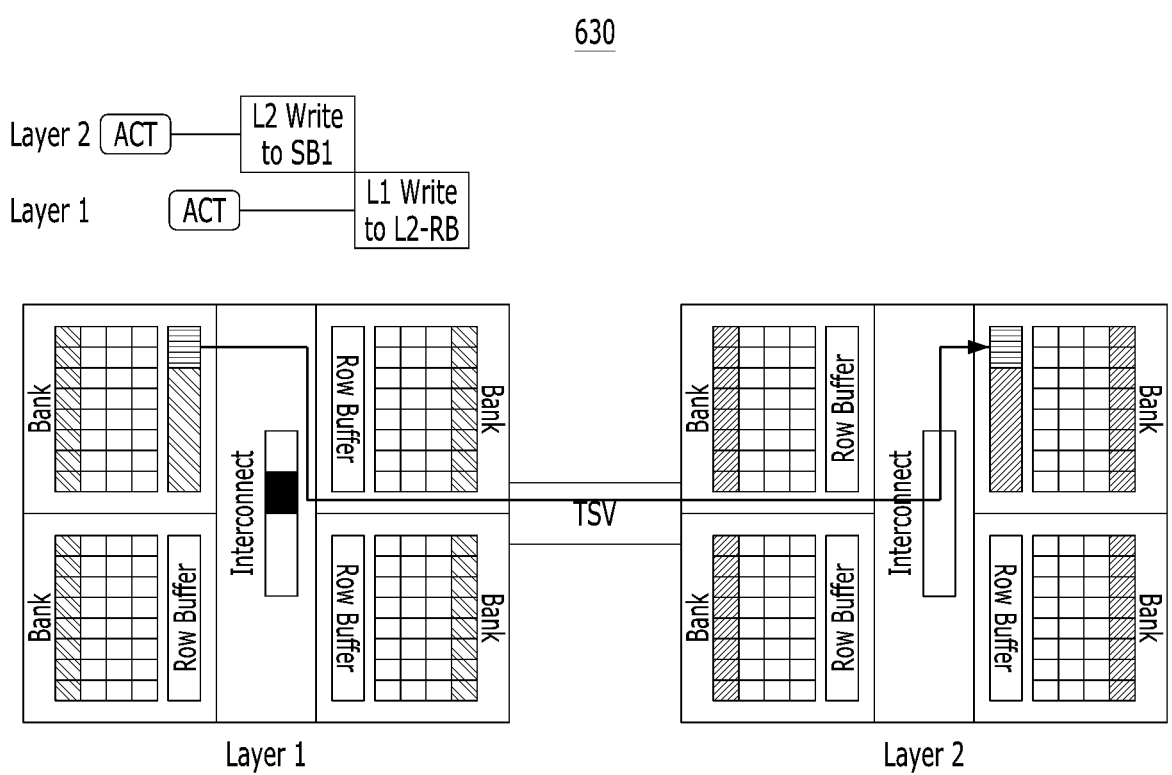
Figure 6D:
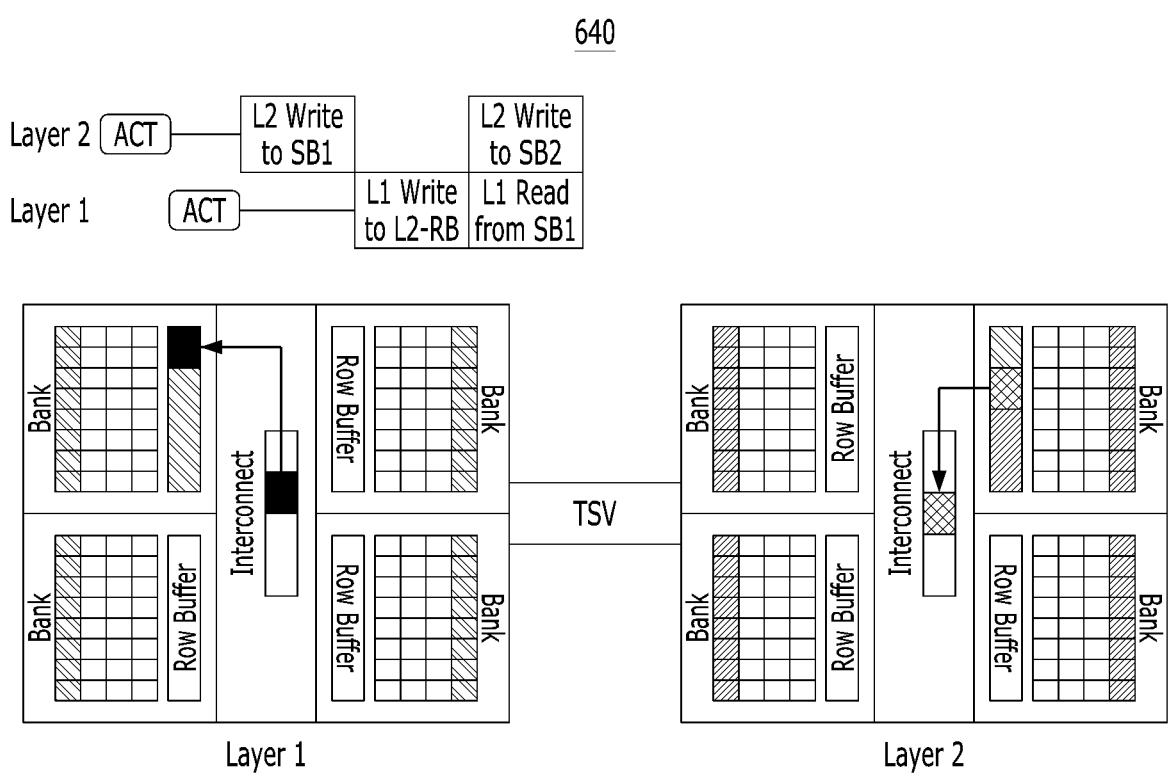
Figure 6E:
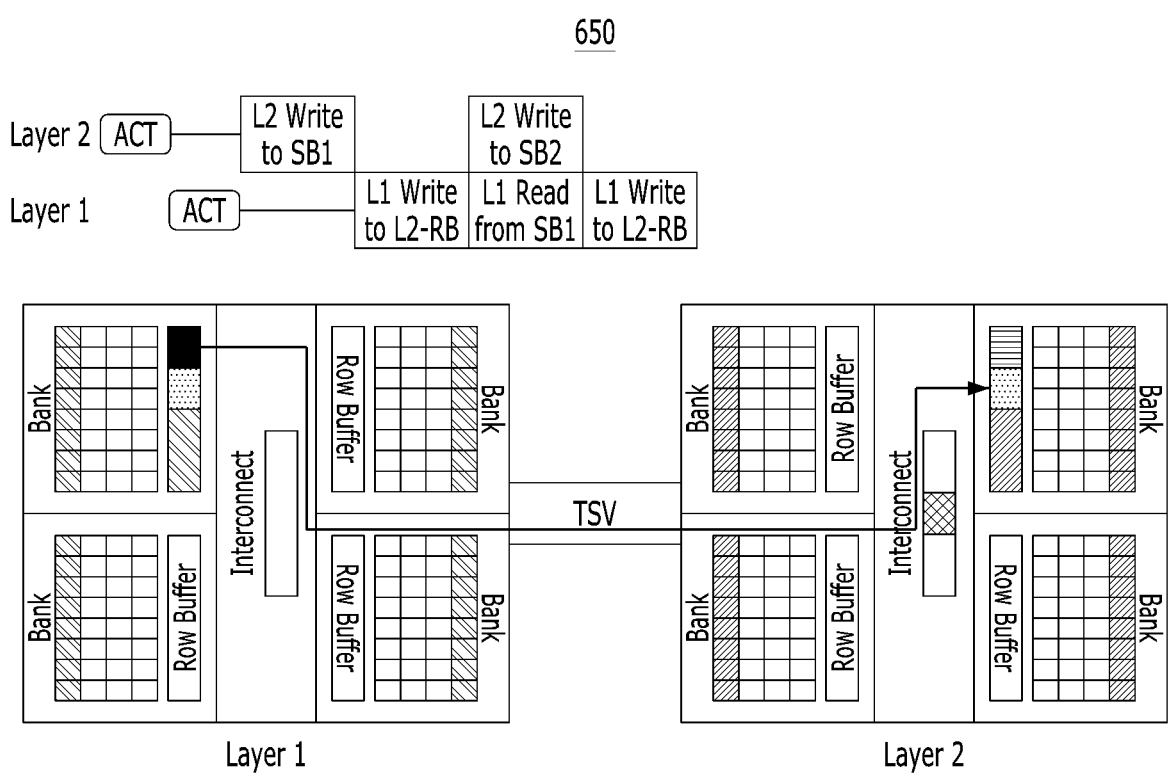
Figure 6F:
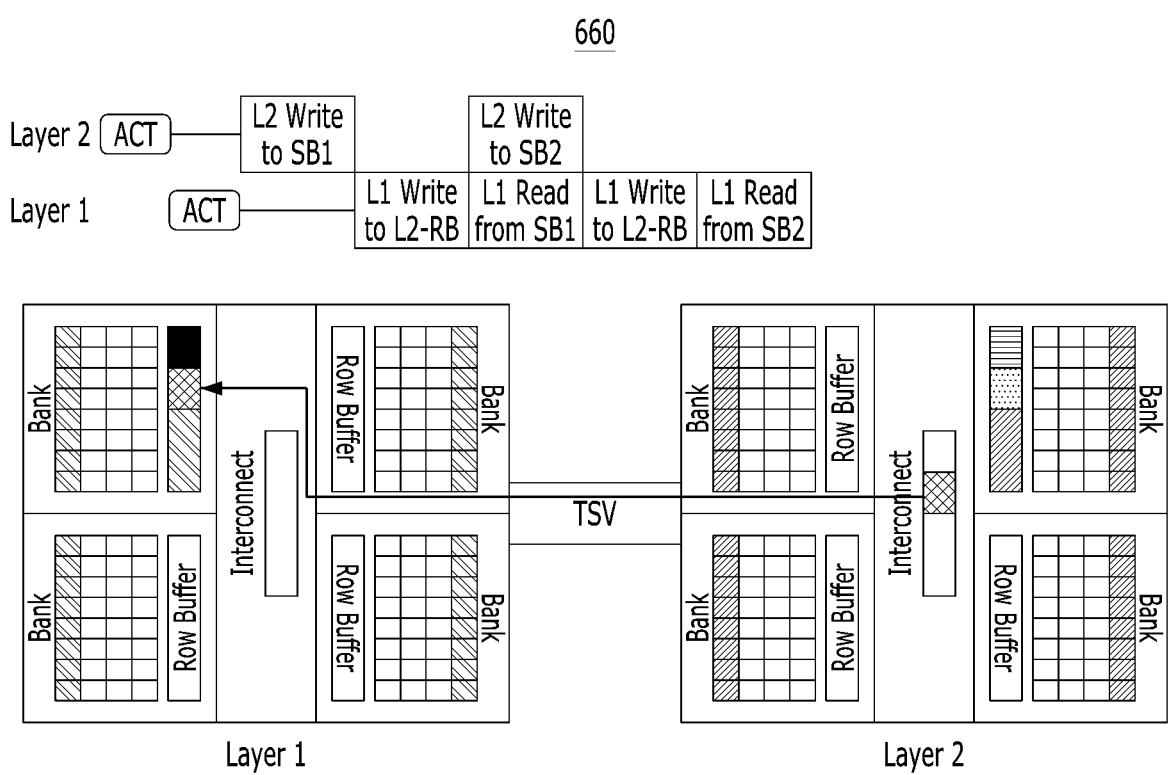
Figure 6G:
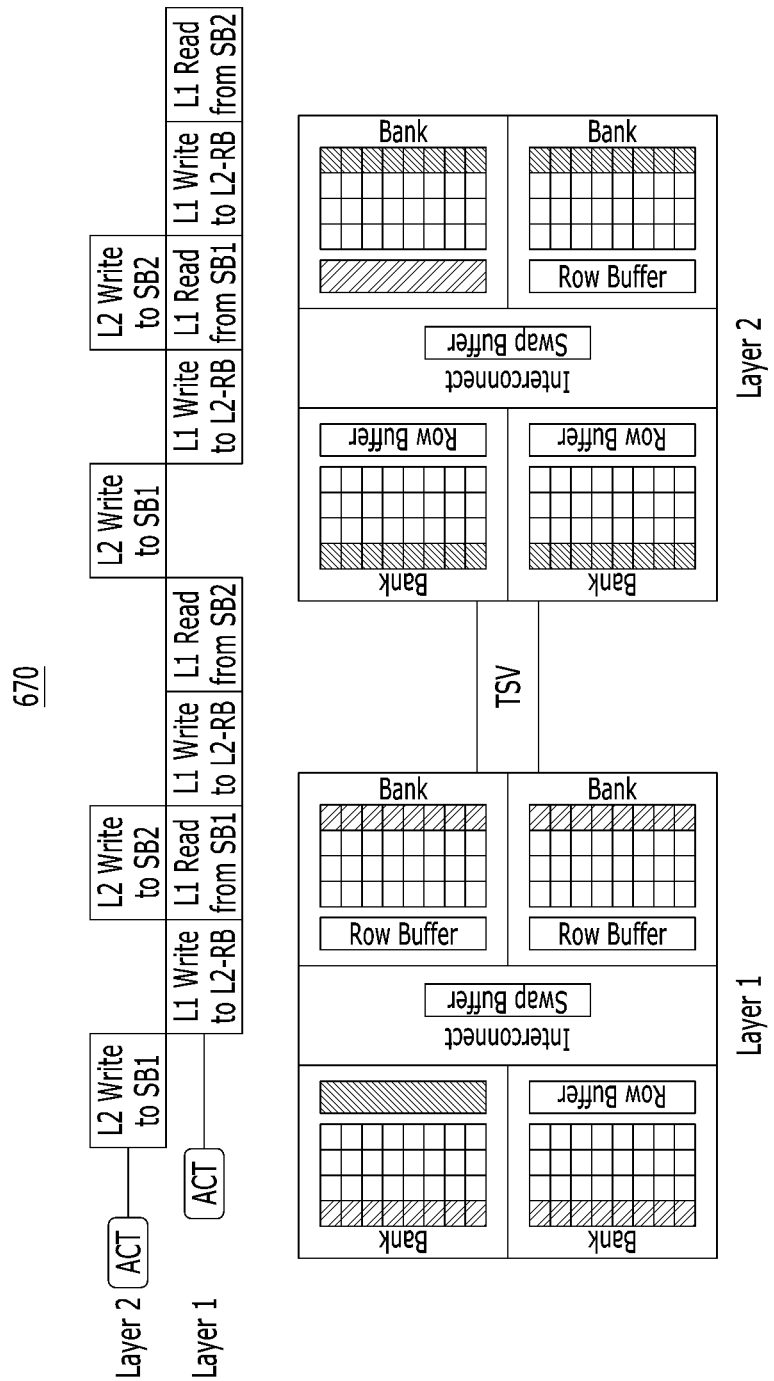
Figure 6H:
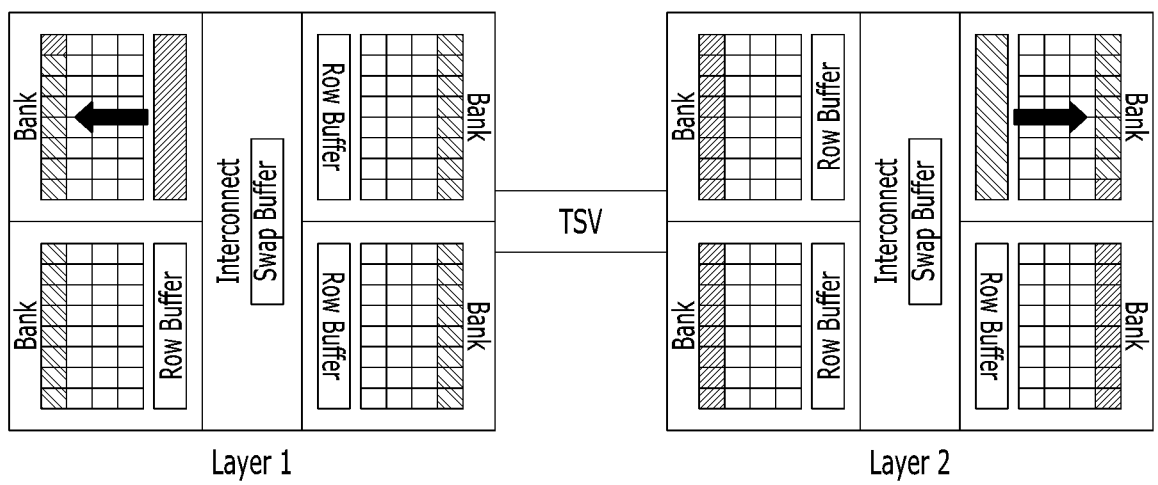

FIG. 5 is a diagram for describing a memory system 500 according to a third embodiment.

In other words, FIG. 5 is a diagram describing another example of the memory system according to an embodiment, which has been described with reference to FIGS. 1 to 4E. A description redundant with the description described in connection with the memory system according to an embodiment, among contents described later with reference to FIG. 5, will be omitted.

Referring to FIG. 5, a swap controller of the memory system 500 according to an embodiment may determine whether to perform a data swap between a first layer 510 including a first swap buffer 511 and a second layer 520 including a second swap buffer 521 among a plurality of layers coupled through at least one TSV channel, and may generate a control command to control a movement of swap data included in the first layer 510 and the second layer 520 based on a result of the determination.

In other words, the memory system 500 according to the third embodiment has a structure in which a swap buffer is present in each channel or layer, data swap operations may be performed between given layers or banks in the same channel, and data swap operations between two banks may be performed within each layer.

For example, the swap controller may be the swap controller 120 of FIG. 1. The first layer 510 may be a memory layer, and the second layer 520 may be a storage layer.

Furthermore, the first layer 510 may be a storage layer, and the second layer 520 may be a memory layer.

According to an aspect, each of the plurality of layers may include a plurality of banks in a region corresponding to each of a plurality of TSV channels. Each of the plurality of banks may include a row buffer.

For example, the first bank 512 of the plurality of banks of the first layer 510 may include the corresponding first row buffer 513, and the third bank 514 thereof may include the corresponding third row buffer 515.

Furthermore, the second bank 522 of the plurality of banks of the second layer 520 may include a corresponding second row buffer 523, and the fourth bank 524 thereof may include a corresponding fourth row buffer 525.

An operating method of the memory system according to the third embodiment is more specifically described below with reference to FIGS. 6A to 6H.

FIGS. 6A to 6H are diagrams for describing an example of the operating method of the memory system according to the third embodiment.

Referring to FIGS. 6A to 6H, the operating method of the memory system according to the third embodiment may be performed in the memory system according to the third embodiment, which has been described with reference to FIG. 5.

Specifically, at step 610, the swap controller of the memory system may generate a control command that controls first swap data, included in the first bank of the plurality of banks included in the first layer, to be moved to the first row buffer corresponding to the first bank, and that controls second swap data, included in the second bank of the plurality of banks included in the second layer, to be moved to the second row buffer corresponding to the second bank.

In other words, the memory system may store the swap data in a corresponding row buffer through row selection in each of the banks including the swap data.

According to an aspect, the swap controller may classify swap data (e.g., first and second swap data) into a plurality of unit data divided in a preset data movement unit, and may generate a control command that controls the plurality of classified unit data to be sequentially moved.

For example, the preset data movement unit may be a page unit or a swap buffer unit.

As a more detailed example, the memory system may classify the first swap data, moved to the first row buffer, into first to n-th unit data (wherein n is a positive integer) by dividing the first swap data, and may sequentially move, to the second row buffer, the first to n-th unit data of the first swap data classified for a data swap operation.

Furthermore, the memory system may classify the second swap data, moved to the second row buffer, into first to n-th unit data (wherein n is a positive integer) by dividing the second swap data, and may sequentially move, to the first row buffer, the first to n-th unit data of the second swap data classified for a data swap operation.

At step 620, the swap controller of the memory system may generate a control command (L2 Write to SB1) that controls the first unit data of the second swap data, moved to the second row buffer, to be moved to the first swap buffer.

In other words, the memory system may move, to a given space of the first swap buffer, the first unit data of the second swap data moved to the second row buffer.

At step 630, the swap controller of the memory system may generate a control command (L1 Write to L2-RB) that controls the first unit data of the first swap data, moved to the first row buffer, to be moved to the second row buffer.

In other words, the memory system may move the first unit data of the first swap data, moved to the first row buffer, to a region that belongs to a plurality of regions of the second row buffer and that corresponds to the first unit data of the second swap data moved to the first swap buffer.

At step 640, the swap controller of the memory system may generate a control command (L1 Read from SB1) that controls the first unit data of the second swap data, moved to the first swap buffer, to be moved to the first row buffer.

Furthermore, the swap controller of the memory system may generate a control command (L2 Write to SB2) that controls the second unit data of the second swap data, moved to the second row buffer, to be moved to the second swap buffer.

For example, at step 640, the two control commands (L1 Read from SB1 and L2 Write to SB2) generated by the swap controller may be generated in the same time interval.

In other words, the memory system may move the first unit data of the second swap data, moved to the first swap buffer, to a region that belongs to a plurality of regions of the first row buffer and that corresponds to the first unit data of the first swap data moved to the second row buffer.

Furthermore, the memory system may move, to a given space of the second swap buffer, the second unit data of the second swap data moved to the second row buffer.

At step 650, the swap controller of the memory system may generate a control command (L1 Write to L2-RB) that controls the second unit data of the first swap data, moved to the first row buffer, to be moved to the second row buffer.

In other words, the memory system may move the second unit data of the first swap data, moved to the first row buffer, to a region that belongs to the plurality of regions of the second row buffer and that corresponds to the second unit data of the second swap data moved to the second swap buffer.

At step 660, the swap controller of the memory system may generate a control command (L1 Read from SB2) that controls the second unit data of the second swap data, moved to the second swap buffer, to be moved to the first row buffer.

In other words, the memory system may move the second unit data of the second swap data, moved to the second swap buffer, to a region that belongs to the plurality of regions of the first row buffer and that corresponds to the second unit data of the first swap data moved to the second row buffer.

At step 670, the swap controller of the memory system may repeatedly generate the control commands corresponding to steps 620, 630, 640, 650 and 660 by repeatedly performing steps 620, 630, 640, 650 and 660.

In other words, at step 670, the memory system may move, to the second row buffer, all of the first swap data (i.e., third to n-th unit data) stored in the first row buffer, and may move, to the first row buffer, all of the second swap data (i.e., third to n-th unit data) stored in the second row buffer.

At step 680, the swap controller of the memory system may control the second swap data, moved to the first row buffer, to be written in the first bank when all of the second swap data are moved to the first row buffer, and may control the first swap data, moved to the second row buffer, to be written in the second bank when all of the first swap data are moved to the second row buffer.

In other words, when the movements of the first swap data and second swap data to the corresponding first and second row buffers are completed, the memory system may perform an operation of writing the moved swap data in the corresponding banks.

Figure 7:
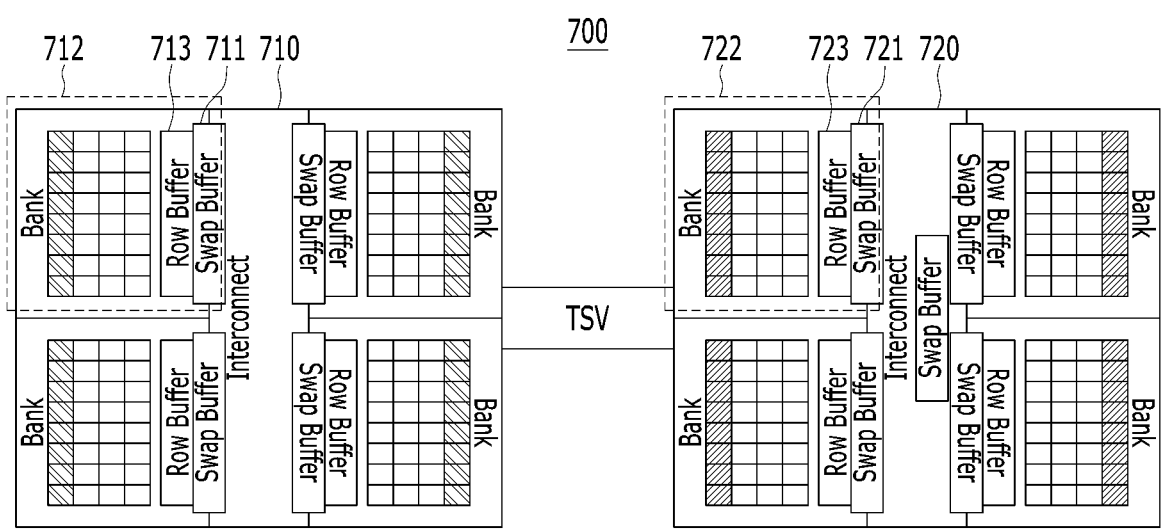
FIG. 7 is a diagram for describing a memory system according to a fourth embodiment.

FIG. 7 is a diagram for describing a memory system 700 according to a fourth embodiment.

In other words, FIG. 7 is a diagram describing another example of the memory system according to an embodiment, which has been described with reference to FIGS. 1, 2, 3A to 3F, 4A to 4F, 5 and 6A to 6H. A description redundant with the description described in connection with the memory system according to an embodiment, among contents described later with reference to FIG. 7, will be omitted.

Referring to FIG. 7, a swap controller of the memory system according to an embodiment may determine whether to perform a data swap between a first layer 710 including a first swap buffer 711 and a second layer 720 including a second swap buffer 721 among a plurality of layers coupled through at least one TSV channel, and may generate a control command that controls a movement of swap data included in the first layer 710 and the second layer 720 based on a result of the determination.

According to an aspect, each of the first swap buffer 711 and the second swap buffer 721 may be included in each of a plurality of banks included in each of the first layer 710 and the second layer 720.

In other words, the memory system 700 according to the third embodiment has a structure in which a swap buffer is present in each of banks included in each layer, data swap operations between given layers or banks in the same channel may be performed, and data swap operations between a plurality of banks may be simultaneously performed within in each layer.

For example, the swap controller may be the swap controller 120 of FIG. 1. The first layer 710 may be a memory layer, and the second layer 720 may be a storage layer.

Furthermore, the first layer 710 may be a storage layer, and the second layer 720 may be a memory layer.

According to an aspect, each of the plurality of layers may include a plurality of banks in a region corresponding to each of a plurality of TSV channels. Each of the plurality of banks may include a row buffer.

For example, a first bank 712 of the plurality of banks of the first layer 710 may include a corresponding first row buffer 713. Furthermore, a second bank 722 of the plurality of banks of the second layer 720 may include a corresponding second row buffer 723.

Figure 8A:
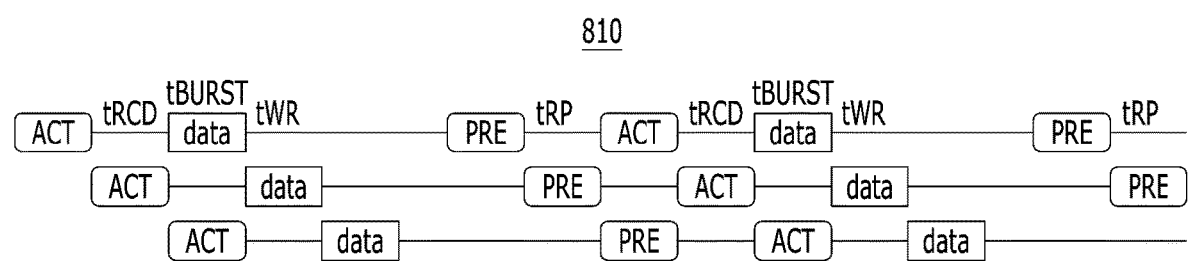
FIGS. 8A to 8C are diagrams for describing a bank-level interleaving operation of the memory system according to an embodiment.
Figure 8B:
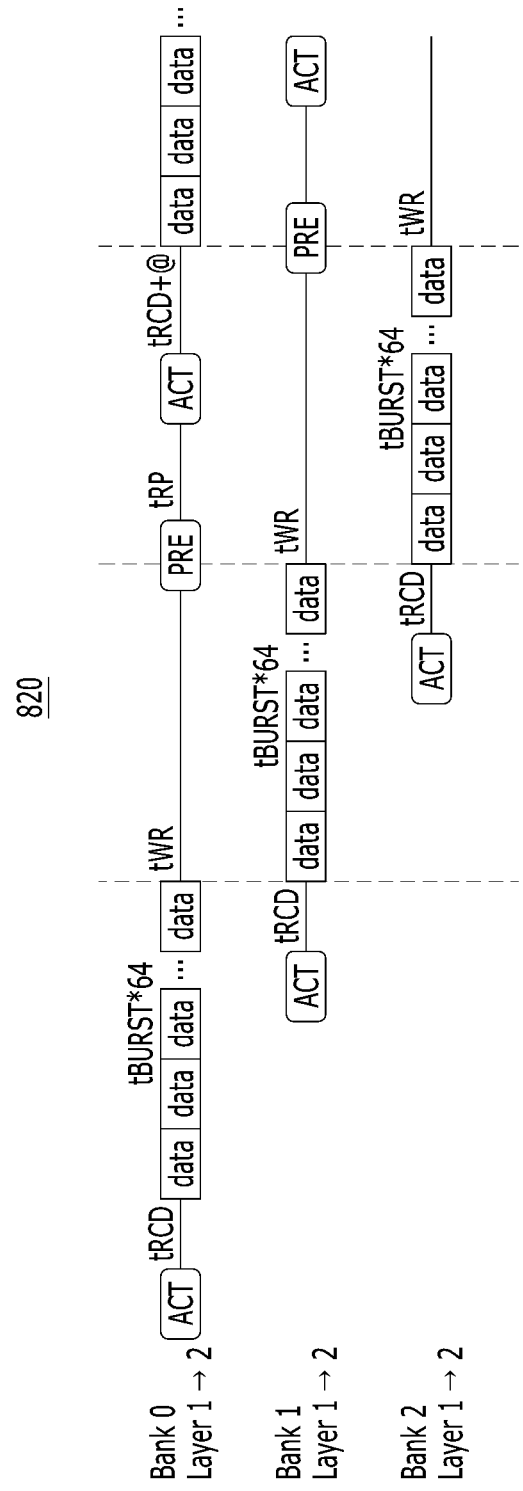
Figure 8C:
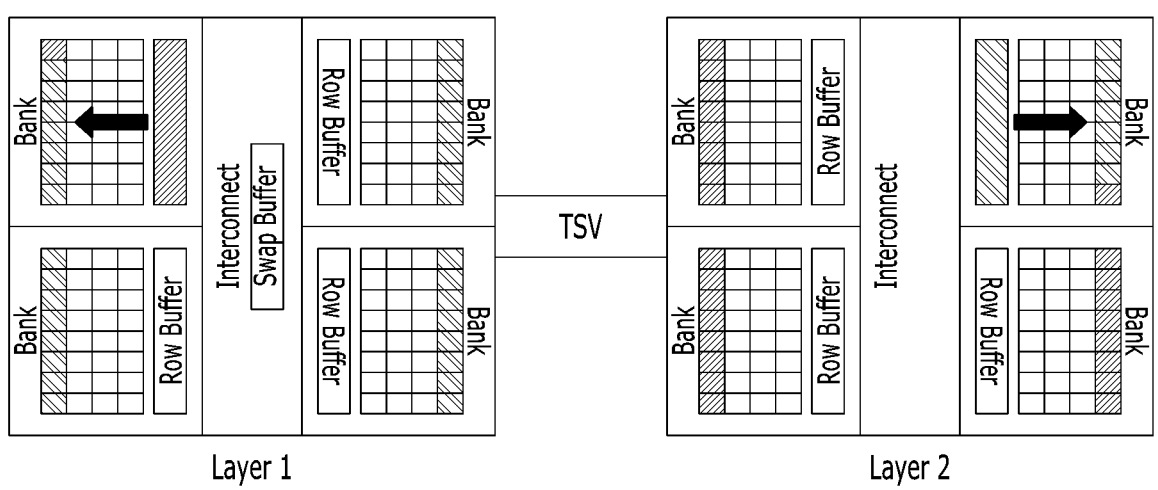

FIGS. 8A to 8C are diagrams for describing a bank-level interleaving operation of the memory system according to an embodiment.

Referring to FIGS. 8A to 8C, reference numeral 810 illustrates a normal interleaving operation, reference numeral 820 illustrates an interleaving operation upon a data swap operation, and reference numeral 830 illustrates an example in which upon a data swap operation, an interleaving operation is performed in a memory system according to an embodiment.

In reference numerals 810 and 820, "tRCD (RAS to CAS)" indicates the time taken so as for corresponding data to be fully stored in a row buffer after row selection. "tBURST" indicates time when unit data is output. "tWR" indicates the time required to transmit data to an actual memory after the data is stored in a row buffer.

For example, in tBURST, 1 page may be transmitted when a 64 B cacheline/4 KB page is transmitted 64 times.

Furthermore, "PRE" indicates a precharge command that enables access to another row by closing a row. "tRP" indicates the time taken for precharge. "ACT(RAS)" indicates a command by which a row is selected and the data of the selected row is stored in a row buffer.

In general, in a memory system, different banks may operate only when independently receiving commands. Only the data of a single bank may be used at a time because an operation of moving data is performed through a TSV channel.

In contrast, the memory system according to an embodiment can improve the bandwidth utilization of a TSV channel by performing bank-level interleaving in a preset movement unit, as illustrated in reference numeral 820.

For example, the preset data movement unit may be a page unit or a swap buffer unit.

That is, after all of swap data to a row buffer, the swap data is written from the row buffer to the sub-array of a corresponding bank, and a data swap operation in another bank is performed in a time interval in which a write operation is performed, without waiting for a very long time interval in which the data is written in the sub-array of the bank. Therefore, the present disclosure can improve the bandwidth utilization of a TSV channel.

Hereinafter, an example in which an interleaving operation is performed in a memory system according to an embodiment upon a data swap operation is more specifically described with reference to reference numeral 830.

In reference numeral 830, the interleaving operation is described based on the memory system according to the first embodiment, but may be likewise performed in the memory systems according to the second to fourth embodiments.

For example, the interleaving operation in reference numeral 830 may be performed at step 360 of the memory system according to the first embodiment, at step 460 of the memory system according to the second embodiment, and at step 680 of the memory system according to the third embodiment.

Specifically, referring to reference numeral 830, the swap controller of the memory system may generate a control command that controls the second swap data, moved to the first row buffer, to be written in the first bank when all of the second swap data are moved to the first row buffer and that controls third swap data, included in the third bank of the plurality of banks included in the first layer, to be written in the third row buffer corresponding to the third bank while the second swap data are written in the first bank.

Furthermore, the swap controller of the memory system may generate a control command that controls the first swap data, moved to the second row buffer, to be written in the second bank when all of the first swap data are moved to the second row buffer and that controls fourth swap data, included in the fourth bank of the plurality of banks included in the second layer, to be moved to the fourth row buffer corresponding to the fourth bank while the first swap data are written in the second bank.

In other words, the memory system may control an operation for writing moved swap data in corresponding banks to be performed when movements of the first swap data and the second swap data to the corresponding first and second row buffers are completed, and may control data swap operations to be performed in other banks of the first layer and the second layer while the write operation is performed.

That is, the present disclosure can improve a swap speed through the improvement in bandwidth utilization of a TSV channel by performing a data swap operation in another bank in a time interval in which a write operation is performed, without waiting for a very long time interval in which data is written in the sub-array of a bank in a row buffer.

As a result, if the present disclosure is used, a swap speed can be improved by optimizing a data swap operation using a swap buffer included in at least one layer.

Furthermore, the bandwidth utilization of a TSV channel can be improved by performing bank-level interleaving in a preset movement unit.

The aforementioned apparatus may be implemented as a hardware component, a software component and/or a combination thereof. For example, the apparatus and components described in the embodiments may be implemented using one or more general-purpose computers or special-purpose computers, for example, a processor, a controller, an arithmetic logic unit (ALU), a digital signal processor, a microcomputer, a field programmable gate array (FPGA), a programmable logic unit (PLU), a microprocessor or any other device capable of executing or responding to an instruction. The processing apparatus may perform an operating system (OS) and one or more software applications executed on the OS. Furthermore, the processing apparatus may access, store, manipulate, process and generate data in response to the execution of software. For convenience of understanding, one processing apparatus has been illustrated as being used, but a person having ordinary skill in the art may understand that the processing apparatus may include a plurality of processing elements and/or a plurality of types of processing elements. For example, the processing apparatus may include a plurality of processors or a single processor and a single controller. Furthermore, other processing configurations, such as a parallel processor, are also possible.

As described above, although the embodiments have been described in connection with the limited embodiments and drawings, those skilled in the art may modify and change the embodiments in various ways from the description. For example, proper results may be achieved although the above technologies are performed in order different from that of the described method and/or the aforementioned elements, such as the system, configuration, device, and circuit, are coupled or combined in a form different from that of the described method or replaced or substituted with other elements or equivalents.

Accordingly, other implementations, other embodiments, and equivalents of the claims belong to the scope of the claims to be described below.

What is claimed is:

1. A memory system comprising:
a first layer including a first bank and a first row buffer configured to temporarily store data corresponding to the first bank;
a second layer including a second bank and a second row buffer configured to temporarily store data corresponding to the second bank;
a single through silicon via (TSV) channel coupled between the first row buffer and the second row buffer;
a swap controller configured to generate a swap control command in response to a request received from an external host and to divide swap data into a plurality of data units having a predetermined size to perform a swap operation between the first layer and the second layer; and
a single swap buffer included only in the first layer among the first layer and the second layer, shared by the first layer and the second layer, and configured to temporarily store second swap data moved from the second layer into the first layer while the single TSV channel is used for transferring first swap data to be moved from the first layer into the second layer,
wherein the swap controller performs the swap operation by:
controlling the first swap data to be moved from the first bank to the first row buffer and controlling the second swap data to be moved from the second bank to the second row buffer corresponding to the second bank;
controlling the second swap data stored in the second row buffer to be moved to the single swap buffer through the single TSV channel;
controlling the first swap data stored in the first row buffer to be moved to the second row buffer through the single TSV channel;
controlling the second swap data stored in the single swap buffer to be moved to the first row buffer; and
controlling the second swap data stored in the first row buffer to be written in the first bank and controlling the first swap data stored in the second row buffer to be written in the second bank.

2. A memory system comprising:
a plurality of memory devices coupled through at least one through silicon via (TSV) channel; and
a swap controller configured to determine whether to perform a data swap between a first memory device including a first swap buffer and a second memory device including a second swap buffer among the plurality of memory devices,
wherein the swap controller controls a first swap data to be moved from a first bank of the first memory device to a first row buffer of the first memory device,
wherein the swap controller controls the first swap data stored in the first row buffer to be moved to a second row buffer of the second memory device through the at least one TSV channel, and controls the first swap data stored in the second row buffer of the second memory device to be written in a second bank of the second memory device, and
wherein the swap controller controls an operation for writing the moved first swap data to be performed when movement of the first swap data to the second bank is completed, while during the writing of the moved first swap data to the second bank utilizing the at least one TSV channel to perform another data swap operation.

3. The memory system of claim 2, wherein the swap controller controls a second swap data to be moved from the second bank of the second memory device to the second row buffer of the second memory device, and
wherein the swap controller controls the second swap data stored in the second row buffer of the second memory device to be moved to the first row buffer of the first memory device through the single TSV channel, and controls the second swap data stored in the first row buffer to be written in the first bank of the first memory device.

4. The memory system of claim 2, wherein the first memory device includes a single swap buffer shared by the first memory device and the second memory device.

5. The memory system of claim 4, wherein the single swap buffer temporarily stores the second swap data moved from the second memory device into the first memory device while the at least one TSV channel is used for transferring the first swap data to be moved from the first memory device into the second memory device.

6. The memory system of claim 2, wherein the swap controller generates a swap control command that controls a plurality of data units of first swap data, included in the first memory device, to be moved to the first row buffer and the plurality of data units of second swap data, included in the second memory device, to be moved to the second row buffer.

7. A memory system comprising:
a first layer including a first bank and a first row buffer configured to temporarily store data corresponding to the first bank;
a second layer including a second bank and a second row buffer configured to temporarily store data corresponding to the second bank;
a single through silicon via (TSV) channel coupled between the first row buffer and the second row buffer; and
a swap controller configured to generate a swap control command in response to a request received from an external host and to divide swap data into a plurality of data units having a predetermined size to perform a swap operation between the first layer and the second layer, wherein the first layer includes a single swap buffer shared by the first layer and the second layer, and configured to temporarily store second swap data moved from the second layer into the first layer while the single TSV channel is used for transferring first swap data to be moved from the first layer into the second layer, wherein the swap controller controls the first swap data to be moved from the first bank to the first row buffer, wherein the swap controller controls the first swap data stored in the first row buffer to be moved to the second row buffer through the single TSV channel and controls the first swap data stored in the second row buffer to be written in the second bank.

8. The memory system of claim 7, wherein the swap controller controls the second swap data to be moved from the second bank to the second row buffer corresponding to the second bank, wherein the swap controller controls the second swap data stored in the second row buffer to be moved to the single swap buffer through the single TSV channel;

wherein the swap controller controls the second swap data stored in the single swap buffer to be moved to the first row buffer and controls the second swap data stored in the first row buffer to be written in the first bank.

9. A memory system comprising:

a first layer including a first bank and a first row buffer configured to temporarily store data corresponding to the first bank;

a second layer including a second bank and a second row buffer configured to temporarily store data corresponding to the second bank;

a single through silicon via (TSV) channel coupled between the first row buffer and the second row buffer;

a swap controller configured to generate a swap control command in response to a request received from an external host and to divide swap data into a plurality of data units having a predetermined size to perform a swap operation between the first layer and the second layer; and a single swap buffer included only in the first layer among the first layer and the second layer, shared by the first layer and the second layer, and configured to temporarily store second swap data moved from the second layer into the first layer while the single TSV channel is used for transferring first swap data to be moved from the first layer into the second layer, wherein the memory system performs the swap operation by:

controlling the first swap data to be moved from the first bank to the first row buffer and controlling the second swap data to be moved from the second bank to the second row buffer corresponding to the second bank;

controlling the second swap data stored in the second row buffer to be moved to the single swap buffer through the single TSV channel;

controlling the first swap data stored in the first row buffer to be moved to the second row buffer through the single TSV channel;

controlling the second swap data stored in the single swap buffer to be moved to the first row buffer; and controlling the second swap data stored in the first row buffer to be written in the first bank and controlling the first swap data stored in the second row buffer to be written in the second bank.

\* \* \* \* \*